US010582618B2

(12) United States Patent
Coleman et al.

(10) Patent No.: US 10,582,618 B2
(45) Date of Patent: Mar. 3, 2020

(54) FABRICATION OF FLEXIBLE ELECTRONIC DEVICES

(71) Applicant: The Regents of the University of California, Oakland, CA (US)

(72) Inventors: Todd Prentice Coleman, La Jolla, CA (US); Dae Kang, Los Angeles, CA (US); Yun Soung Kim, San Diego, CA (US); Mridu Sinha, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 396 days.

(21) Appl. No.: 15/311,125

(22) PCT Filed: May 18, 2015

(86) PCT No.: PCT/US2015/031425
§ 371 (c)(1),
(2) Date: Nov. 14, 2016

(87) PCT Pub. No.: WO2015/176065
PCT Pub. Date: Nov. 19, 2015

(65) Prior Publication Data
US 2017/0079144 A1    Mar. 16, 2017

Related U.S. Application Data

(60) Provisional application No. 61/994,784, filed on May 16, 2014.

(51) Int. Cl.
*H05K 3/00* (2006.01)
*H05K 1/02* (2006.01)
(Continued)

(52) U.S. Cl.
CPC .......... *H05K 3/007* (2013.01); *H05K 1/0283* (2013.01); *H05K 1/118* (2013.01); *H05K 3/027* (2013.01);
(Continued)

(58) Field of Classification Search
CPC .... H05K 1/0283; H05K 1/0393; H05K 3/007; H05K 3/027; H05K 3/06; H05K 3/061;
(Continued)

(56) References Cited

U.S. PATENT DOCUMENTS 5,403,700 A    4/1995 Heller et al.
5,879,964 A    3/1999 Shin et al.
(Continued)

OTHER PUBLICATIONS

Kim, D et al. "Epidermal Electronics," Science, Aug. 12, 2011, 8 pages.
(Continued)

*Primary Examiner* — Peter Dungba Vo
*Assistant Examiner* — Joshua D Anderson
(74) *Attorney, Agent, or Firm* — Perkins Coie LLP

(57) ABSTRACT

Disclosed are methods for fabrication of flexible circuits and electronic devices in cost effective manner that can include integration of submicron structures directly onto target substrates compatible with industrial microfabrication techniques. In one aspect, a method to fabricate an electronic device, includes depositing an electrically conductive layer on a processing substrate including a weakly-adhesive interface layer on a support substrate; depositing an insulating layer on the conductive layer to attach to the conductive layer; forming a circuit on the processing substrate by etching selected portions of the conductive layer based on a circuit design; and producing a flexible electronic device by attaching a flexible substrate to the formed circuit on the processing substrate and detaching the circuit and the flex-
(Continued)

ible substrate from the interface layer, in which the flexible electronic device includes the circuit attached to the flexible substrate.

15 Claims, 14 Drawing Sheets

(51) Int. Cl.
    *H05K 1/11*     (2006.01)
    *H05K 3/02*     (2006.01)
    *H05K 3/06*     (2006.01)
    *H05K 3/46*     (2006.01)
    *H01L 21/683*     (2006.01)

(52) U.S. Cl.
    CPC ........... *H05K 3/061* (2013.01); *H05K 3/4644* (2013.01); *H01L 21/6835* (2013.01); *H05K 2201/10151* (2013.01); *H05K 2203/0152* (2013.01)

(58) Field of Classification Search
    CPC ........ H05K 3/064; H05K 3/284; H05K 3/386; H05K 3/46; H05K 3/4644; H05K 3/467; H01L 21/6835; H01L 2221/68304; H01L 2221/68345; H01L 2221/68363
    See application file for complete search history.

(56) References Cited

U.S. PATENT DOCUMENTS

| | | |
|---|---|---|
| 2005/0285231 A1 | 12/2005 | Arao et al. |
| 2009/0317639 A1* | 12/2009 | Axisa .................... B32B 37/185 428/411.1 |
| 2011/0144470 A1 | 6/2011 | Mazar et al. |
| 2012/0086035 A1 | 12/2012 | Yen |

OTHER PUBLICATIONS

Patel, J. et al., "A sacrificial SU-8 mask for direct metallization on PDMS," Journal of Micromechanics arid Microengineering, 2009, 10 pages.

Patel, J. et al., "PDMS as a sacrificial substrate for SU-8-based biomedical and microfluidic applications," Journal of Micromechanics and Microengineering, 2008, 11 pages.

International Search Report and Written Opinion of International Application No. PCT/US2015/031425; dated Aug. 7, 2015, 10 pages.

Hussain et al., "CMOS-Technology-Enabled Flexible and Stretchable Electronics for Internet of Everything Applications", Adv. Mater. 2016, 28, pp. 4219-4249.

* cited by examiner

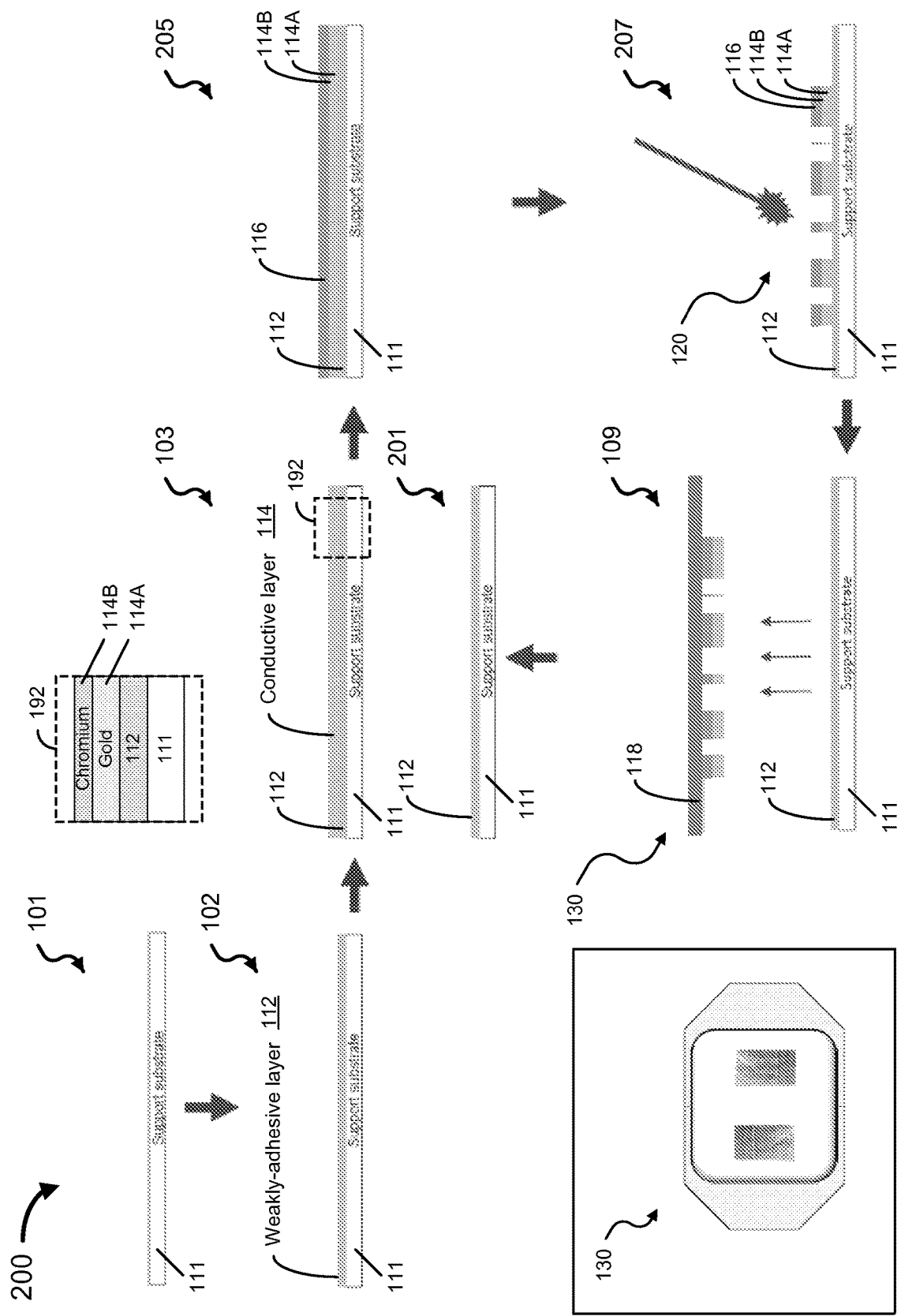

FABRICATION OF FLEXIBLE ELECTRONIC DEVICES

CROSS REFERENCE TO RELATED APPLICATIONS

This patent document is a 35 USC § 371 National Stage application of International Application No. PCT/US2015/031425, entitled "FABRICATION OF FLEXIBLE ELECTRONIC DEVICES," which claims the benefits and priority of U.S. Provisional Patent Application No. 61/994,784, entitled "FABRICATION OF FLEXIBLE ELECTRONIC DEVICES", filed on May 16, 2014. The entire contents of the aforementioned patent applications are incorporated by reference as part of the disclosure of this application.

TECHNICAL FIELD

This patent document relates to systems, devices, and processes to fabricate and use flexible electronic devices and circuits technologies.

BACKGROUND

Flexible electronic devices, or flexible circuits, can include electric circuits and devices formed on flexible substrates that can be applied to and conform to a variety of surface geometries. For example, flexible electronics have a capability that they can wrap or be bended, and can be shaped to fit to curvilinear surfaces. Flexible electronics may be configured to achieve desired mechanical properties that approach those of flexible carrier substrates that the flexible electronics are mounted or integrated.

SUMMARY

New classes of ultrathin flexible and stretchable devices are changing the way modern electronics are designed to interact with their target systems. As more electronics-based technologies develop and emerge, optimal and scalable fabrication procedures are needed to produce electronics devices so that large-scale industrial translation and commercialization of these devices is realistic.

Disclosed are systems, devices and manufacturing methods to produce flexible circuits on flexible substrates. The disclosed techniques allow for fabrication of custom and flexible circuits in a cost effective manner that can include integration of micron and submicron structures directly onto target substrates using processes compatible with large-scale industrial fabrication. Implementations of the disclosed techniques can enable high volume, low cost scalable manufacturing for flexible electronics.

In one aspect, a method to fabricate an electronic device includes depositing an electrically conductive layer on a processing substrate, in which the processing substrate includes an interface layer including a weakly-adhesive material on a support substrate; depositing an insulating layer on the conductive layer that attaches to the conductive layer; forming a circuit structure on the processing substrate by removing selected portions of the conductive layer based on a circuit design; and producing a flexible electronic device by attaching a flexible substrate to the formed circuit structure on the processing substrate and detaching the circuit structure and the flexible substrate from the interface layer, in which the flexible electronic device includes the circuit structure attached to the flexible substrate.

In one aspect, a method to fabricate a circuit includes providing a processing substrate structured to include a weakly-adhesive surface on a support substrate; depositing an electrically conductive layer on the weakly-adhesive surface of the processing substrate; depositing an insulating layer on the conductive layer that attaches to the conductive layer; etching the conductive layer on the processing substrate to form a circuit; and attaching a flexible substrate to the formed circuit on the processing substrate.

In one aspect, a method to fabricate an electronic device includes providing a processing substrate structured to include a weakly-adhesive layer on a support substrate, in which the weakly-adhesive layer includes a well at a predetermined position in the weakly-adhesive layer; placing an electronic components into the wells of the processing substrate; depositing an electrically conductive layer on the processing substrate; depositing an insulating layer on the conductive layer that attaches to the conductive layer; forming a circuit structure on the processing substrate by removing selected portions of the conductive layer based on a circuit design, in which the circuit structure includes the electronic component and interconnections that electrically interface with contact pads of the electronic component; and producing a flexible electronic device by attaching a flexible substrate to the formed circuit structure on the processing substrate, and detaching the circuit structure with the flexible substrate from the weakly-adhesive layer.

In one aspect, a method to fabricate a circuit includes providing a support substrate with a weakly-adhesive layer on the support substrate; depositing a metal layer on the weakly-adhesive layer to form conductive regions for a circuit; patterning a photo-definable polymer layer on the metal layer; etching the metal layer to form the circuit while on the weakly-adhesive layer; and forming a flexible circuit by applying a flexible final substrate to attach to the circuit while on the weakly-adhesive layer on the support substrate.

Some exemplary features and applications of the disclosed technology include the following. The disclosed fabrication methods can be utilized for industrial production of flexible electronics for a variety of fields including, but not limited to, medicine, engineering, and consumer products. The disclosed technology can be used for any situation requiring acquisition and/or facilitation of electrical, optical, chemical, and mechanical signals. The disclosed microfabrication methods and processing techniques can be used to produce adhesive-peeled (AP) flexible electronics devices. In some implementations, for example, the method includes assembling electronics (e.g., such as sensors, antennas, or other circuits and/or chip devices) on a weak-adhering substrate in an inverted fashion, allowing the assembled electronics to be attached to the target flexible substrate to produce the device. The disclosed methods can significantly reduce end-to-end processing time and costs that achieve greater levels of fabrication yield. The disclosed methods obviate the need of a sacrificial layer or intermediate transfer printing, and allow for direct integration of the sensor from a temporary donor substrate (e.g., weak adhesive interface) to the target receiving flexible substrate. The disclosed technology is capable to replace or to compatibly integrate with existing fabrication methodologies with large-scale post-processing using an exemplary roll-to-roll approach of the disclosed methods.

Those and other features are described in greater detail in the drawings, the description and the claims.

BRIEF DESCRIPTION OF THE DRAWINGS

FIGS. 2A-2B shows illustrative diagrams of other embodiments of fabrication methods of the disclosed technology to produce flexible electronic devices.

DETAILED DESCRIPTION

Figure 1A:
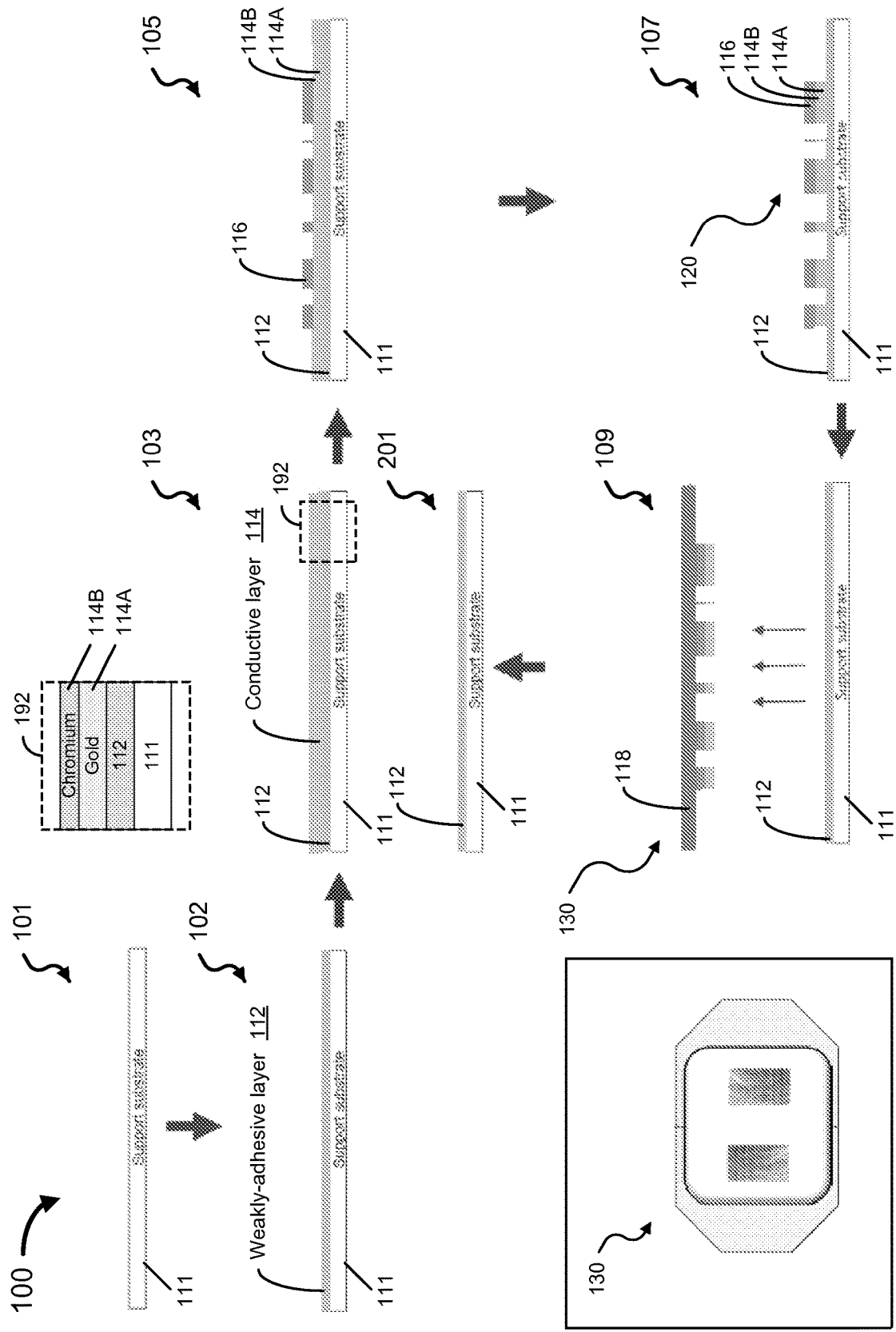
FIG. 1A shows an illustrative diagram of an exemplary fabrication method of the disclosed technology to produce a flexible electronic device.

Fabrication of electronic devices that include active and/or passive electrical components can be carried out in various ways. One example of developing a device is to manually fabricate a relatively simple electronic device, one in which may contain a small number of electronic components or parts. This type of approach may allow for lower cost and provide greater flexibility in managing design variations, but manual fabrication approaches are significantly limited in the complexity of devices that can be developed and are inefficiently time-consuming and non-scalable for device production. Another example of existing fabrication approaches is to invest in a foundry to receive reliable, complex circuit designs to then process and form a working device from such designs. However, the foundry solution in various implementations is expensive with respect to cost, inflexible with respect to design variations, and time-consuming for preparation of final designs prior to fabrication. Additionally, for example, with the foundry approach, one cannot expect a comparable capacity/performance of a conventional chip device due to restrictions in thickness.

Disclosed are highly-scalable, cost-effective, and simplified manufacturing methods to produce flexible circuits and electronic devices on flexible substrates. The disclosed techniques allow for fabrication of custom and large-scale flexible circuits in cost effective manner that can include integration of micron and submicron structures into adhesives compatible with industrial microfabrication techniques.

Some existing microfabrication methods of flexible circuits and systems use a dissolvable "glue" between a supporting substrate on which the circuit is fabricated and the final flexible circuit. Once the flexible circuit is completely fabricated, a solvent may be used to dissolve the "glue", thus releasing the flexible circuit in a sometimes seemingly random and uncoordinated manner. This conventional process is a cumbersome process that can cause damage to the flexible circuit (e.g., in which the circuit easily breaks on the flexible substrate) or can distort the features of the flexible circuit.

The disclosed fabrication methods do not include intermediary steps involving the "glue", and the release of the flexible circuit does not require dissolution of any interfacing materials. In some implementations, the disclosed methods include providing a support substrate and forming a weakly-adhesive layer on the support substrate to interface with the material layers that will form the circuit. For example, the weakly-adhesive layer may include a planar surface for subsequent construction of flexible circuits via a microfabrication technique. The weakly-adhesive layer is selected to be adhesive enough to maintain desired system features through the microfabrication process, but the adhesiveness is weak enough to release the fabricated flexible circuit onto a final substrate (e.g., flexible substrate) in a controlled manner, with a minimal mechanical force. The flexible substrate can allow for the final flexible circuit or electronic device to bend and stretch, e.g., for appropriate applications that require small size and bendability or stretchability (e.g., such as a wearable device, in vivo device, etc.), or attachment to curved, irregularly shaped, or non-flat or moving devices.

Exemplary Embodiments

FIG. 1A shows an illustrative diagram of an exemplary fabrication method 100 to produce a flexible electronic device capable of being peeled off of a re-usable processing substrate. As shown in FIG. 1A, the method 100 includes a process 101 to provide a support substrate 111. For example, the support substrate 111 may be made of glass or silicon (Si), e.g., such as a Si wafer. The support substrate 111 may be made of another material or materials as well. The support substrate 111 may have a flat surface. The method 100 includes a process 102 to form a weakly-adhesive layer 112 on the support substrate 111. In some implementations of the process 102, for example, the weakly-adhesive layer 112 may be formed by coating a weakly-adhesive material, e.g., such as poly(dimethylsiloxane) (PDMS), other silicone elastomers such as Silbione® and Solaris®, or polymers such as polyimide and negative or positive-tone photoresists onto the exemplary flat surface of the support substrate 111 to form a layer that possesses a weakly-adhesive feature on its top-exposed surface. The weakly-adhesive layer 112 may comprise a planar surface that acts as a weakly-adhering substrate for subsequent construction of a flexible circuits and devices by a microfabrication technique. The weakly-adhesive layer may be adhesive enough to maintain desired system features through the microfabrication process, but the adhesiveness is weak enough to release the fabricated flexible circuit onto a final flexible substrate in a controlled manner, with a minimal mechanical force. The example shown in FIG. 1A shows only one weakly-adhesive layer. In other implementations, for example, there may be two or more weakly-adhesive layers formed on the support substrate 111. Also, for example, the weakly-adhesive layer may be reusable.

Some conventional microfabrication methods of flexible circuits and systems use a dissolvable "glue", e.g., poly (methyl methacrylate) (PMMA), between a support substrate and the flexible circuits and systems fabricated on the support substrate. Once the flexible circuit is completely fabricated using these conventional techniques, a solvent (e.g., acetone) is typically used to dissolve the "glue", thus releasing the flexible circuit in a seemingly random and uncoordinated manner. In operations, such conventional microfabrication methods tend to require experienced personnel to implement these techniques. And, for example, the more complex a flexible circuit design is, the more time and training is necessary for the operator to accomplish the fabrication successfully. In contrast, for example, the illustrated exemplary method 100 based on the disclosed technology does not involve such "glue" or associated processing techniques and constraints; and the release of the flexible circuit does not require dissolution of any interfacing materials in implementations of the exemplary method 100. Instead, for example, the adhesiveness of the weakly-adhesive layer is selected to allow release of the fabricated circuit, device, and/or system onto a final substrate in a controlled manner, with a minimal mechanical force. Moreover, because the method 100 obviates the use of such "glue" layers, material issues with biocompatibility are minimized, if not eliminated.

The method 100 includes a process 103 to deposit a conductive layer 114 (e.g., one or more metal layers) on the weakly-adhesive layer 112 to provide structure for a flexible circuit that is to be fabricated on the processing substrate (e.g., the weakly-adhesive layer 112 on the support substrate 111). In some embodiments, for example, a plurality of metal layers can be deposited on the weakly-adhesive layer 112 in a specific order for the flexible circuit. For example, as illustrated in the inset 192 in the diagram depicting the process 130 shown in FIG. 1A, a metal layer 114A made of gold can be deposited first on the weakly-adhesive layer 112, followed by a metal layer 114B made of chromium deposited on the gold metal layer, e.g., in which the metal layer 114B allows for good adhesion with subsequent layers. For example, the conductive layer 114 (e.g., metal layers 114A and 114B) can function as circuit components, interconnections, and other structures for a flexible circuit to be formed.

The method 100 includes a process 105 to form an insulating layer 116 on the conductive layer 114, e.g., which attaches to the conductive layer 114. For example, the insulating layer 116 provides a layer to which the final flexible substrate can adhere to, and the insulating layer 116 maintains the formed device components (e.g., etched features of the conductive layer 114 as part of the structure of the circuit) in the final flexible electronics device. For example, the insulating layer 116 can preserve structural integrity of the device components and features as part of the final flexible electronic device and as part of the circuit being formed on the processing substrate during the method 100. For example, the insulating layer 116 can prevent leakage current in operations of the final flexible electronic device. For example, the insulating layer 116 can be used to create the circuit by providing a pattern or design to the features to be formed during the method 100, e.g., by wet etching. In some implementations, for example, the insulating layer can include polymers such as polyimide, photoresists such as SU-8 or that of the Shipley Microposit® S1800® series, or dry film photoresists that can be laminated onto the conductive layer 114. In some embodiments, for example, the process 105 can include patterning an insulating, photo-definable polymer layer above the conductive layer 114. The exemplary photo-definable polymer layer may be formed by laminating a polymer material onto the surface of the conductive layer 114, selectively patterned, and cured. The exemplary photo-definable polymer layer can serve as both a support for the flexible circuit and a mask for wet etch processing of the conductive layer 114 (e.g., the metal layers 114A and 114B). It is noted there that conventional fabrication methods typically require extended procedures which include the creation of a wet etch mask and a dry etching of a non-photo-definable polymer layer, presenting costly fabrication issues if the dry etching mechanism used is not carefully optimized. By utilizing the exemplary photo-definable polymer layer 116 as shown in the process 105, the illustrated example method 100 eliminates the need for dry etching, and therefore decreases overall fabrication time and cost while increases product yield.

As depicted in FIG. 1A, the deposition of the conductive layer 114 (e.g., such as the gold layer 114A before the chromium adhesion layer 114B) and the polymer layer 116 is in a reversed order as compared to other conventional device fabrication methods. For example, the deposition of the conductive layer 114 allows a one-way transferring of the flexible circuit directly onto the final substrate with the interfacing metal layer exposed, as intended. This obviates the need for an intermediate transfer step to transfer the flexible circuit onto an intermediate "stamp" substrate as existing microfabrication methods typically do, e.g., therefore saving time and further improving the production yield.

The method 100 includes a process 107 to form a circuit 120 on the processing substrate. The process 107 forms the circuit 120 by removing certain portions of the conductive layer 114 and preserving selected portions (e.g., pattern-masked regions) to form components, interconnects, and/or other structural features of the circuit according to a circuit design or layout. In some embodiments, for example, the process 107 includes etching the certain portions of the conductive layer, e.g., based on the circuit design or layout. For example, the process 107 can include wet etching the conductive layer 114 based on a pattern formed by the exemplary photo-definable polymer layer 116 on the conductive layer. Wet etching of the metal layers 114A and 114B, for example, while using the exemplary photo-definable polymer 116 as a mask, projects the mask image onto the metal layers, which can extend down to the weakly-adhesive layer 112 without damaging the weakly-adhesive layer 112. For example, as illustrated in FIG. 1A, the chromium metal layer 114B is wet etched first, and the gold metal layer 114 is subsequently wet etched.

The method 100 includes a process 109 to produce a flexible electronic device 130 by attaching a flexible substrate 118 to the formed circuit 120 on the processing substrate and detaching the circuit 120 with the flexible substrate 118 attached thereto from the weakly-adhesive layer 112. The produced flexible electronic device 130 includes the circuit 120 attached to the flexible substrate 118. For example, the flexible substrate 118 can include Tegaderm™, Scotch Tape™, and other flexible substrates that are otherwise non-adhesive but can be made so through the application of adhesives. An example of this is a section of cloth on a shirt that can be made adhesive for the purpose of attaching a formed circuit 120. For example, the flexible substrate 118 may be different from the support substrate 111, in which the final substrate may be adhesive, thin, and flexible, possessing controlled design thicknesses and features specific to its designated use. This process 109 advantageously removes the need for an intermediate transfer step to transfer the flexible circuit onto an intermediate "stamp" substrate, as existing conventional methods typically require. Specifically, for example, detachment of the flexible circuit 120 from the weakly-adhesive processing substrate 111 and 112 to the final flexible substrate 118 is the only process that the device is transferred.

FIG. 1A shows an inset featuring the flexible electronic device 130, e.g., showing an illustration of microfabricated structures adhered on a flexible substrate (e.g., which can include multiple fabricated circuits, devices, and/or systems attached to a single flexible substrate 118, as depicted in the inset). At this point, the flexible electronic device 130 can be post-processed or can be used for its intended purpose. For example, the flexible electronic device 130 can include an electrical circuit and/or electronic components that are electrically coupled via electrical interconnections of the circuit architecture of the device 130. Examples of the electronic components can include microchips, circuit components, and other type devices.

The method 100 can also include a process 201 that re-uses the processing substrate (the weakly-adhesive layer 112 on the support substrate 111) in subsequent implementations of the method 100, e.g., instead of the processes 101 and 102. For example, the exemplary process 201 can provide the processing substrate having the weakly-adhesive layer formed on top of the support substrate, in which the processing substrate may be a reused product of the processes 101 and 102 or the process 109, as illustrated in FIG. 1A.

Figure 1B:
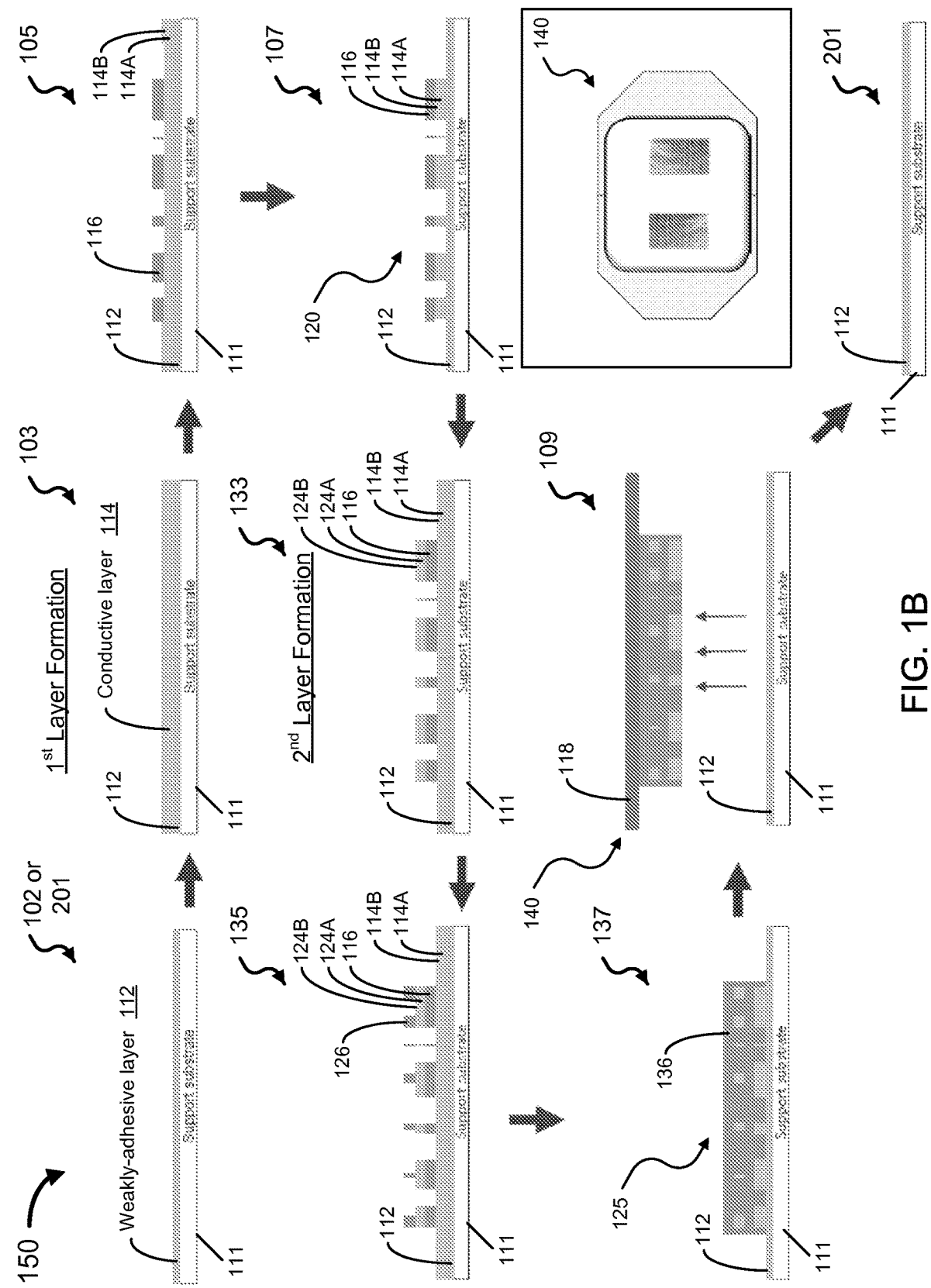
FIG. 1B shows an illustrative diagram of an exemplary fabrication method of the disclosed technology to produce a multi-layer flexible electronic device.

FIG. 1B shows an illustrative diagram of an exemplary fabrication method 150 to produce a multi-layer flexible electronic device, e.g., which capable of being peeled off of a re-usable processing substrate. As shown in FIG. 1B, the method 150 includes the processes 102 or 201, 103, 105, and 107 to form a first layer of the circuit 120 on the processing substrate. The method 150 includes a process 133 to deposit a second conductive layer 124 (e.g., one or more metal layers) on the processing substrate for the flexible multi-layered circuit. For example, in some implementations of the process 133, a plurality of metal layers can be deposited on the formed single layer circuit 120 (e.g., over the insulating layer 116), which may also deposit over uncovered regions of the weakly-adhesive layer 112 on the support substrate 111. For example, a second gold layer 124A can be deposited first on the processing substrate, followed by a second chromium layer 124B deposited on the second gold layer 124A. For example, the second conductive layer 124 can function as circuit components, interconnections, and other structures in an additional layer for a multi-layer flexible circuit to be formed. In some implementations of the method 150, for example, interconnections between the conductive layers 114 and 124 may be formed based on the overall circuit design or layout of a multi-layered flexible device, e.g., in which the process 133 may deposit the second conductive layer 124 to make contact with exposed regions of the conductive layer 114.

In some implementations of the method 150, for example, following the process 107 (e.g., wet etching or precision etching technique, such as laser etching) to produce the first layer of the circuit for a multi-layered flexible electronic circuit, device or system, an encapsulation (e.g., total or partial encapsulation) of the first layer circuit 120 can be performed. An example of an encapsulation process can include the use of a liquid polymer (e.g., polyimide) which is deposited over the entire first layer to a thickness allowing a flat working surface for subsequent layer processing. The exemplary encapsulating polymer layer is then cured to a solid (but flexible) state to produce an encapsulated single layer circuit (not shown).

The method 150 includes a process 135 to form a second insulating layer 126 on the second conductive layer 124, e.g., which attaches to the second conductive layer 124. For example, the second insulating layer 126 provides a layer to which the final flexible substrate can adhere to or a layer on which to build an additional circuit layer or layers. In some embodiments, for example, the process 135 can include patterning a second insulating, photo-definable polymer layer at selected regions above the second conductive layer 124 to form the design of the second layer of the multi-layered circuit. For example, the exemplary second photo-definable polymer layer may be formed by laminating a polymer material (e.g., polyimide) onto the surface of the conductive layer 124, selectively patterned, and cured, e.g., in which the exemplary second photo-definable polymer layer can serve as both a support for the multi-layered flexible circuit and a mask for wet etch processing of the second conductive layer 124 (e.g., the metal layers 124A and 124B).

The method 150 includes a process 137 to form a multi-layered circuit 125 on the processing substrate. The process 137 forms the multi-layered circuit 125 by removing certain portions of the second conductive layer 124 and preserving selected portions (e.g., pattern-masked regions covered by the second insulating layer 126) to form components, interconnects, and/or other structural features of the multi-layered circuit 125 according to the desired circuit design or layout. In some embodiments, for example, the process 137 can include wet etching the second conductive layer 124 based on a pattern formed by the exemplary second photo-definable polymer layer 126.

The process 137 includes forming an encapsulation 136 of the multi-layer circuit 125, e.g., in which the type of encapsulation can be performed based on the subsequent processing. In some implementations, for example, if a third layer (or more) is desired, encapsulation of the aggregate circuit comprised of the first and second layers is performed, and the relevant processes of the method 150 can be repeated (e.g., repeating the processes 133, 135, and 137). For example, such layer-by-layer encapsulation techniques can ensure that each circuit layer can be designed freely (e.g., without patterning constraints in the x-y-z dimensions). For example, a liquid polymer (e.g., polyimide) can be deposited over the circuit 125 to a thickness allowing a flat working surface for subsequent layer processing, after which the exemplary encapsulating polymer layer is then cured to a solid (but flexible) state. In implementations of the method 150 where a two-layer multi-layer circuit 125 (as depicted in FIG. 1B) is desired, for example, the process 137 includes forming the encapsulation 136 of the multi-layered circuit 125 such that it totally encapsulates the circuit 125, e.g., preserving the structural integrity of the device components and features of the multi-layer flexible electronic device 140, and insulating the device 140 to prevent leakage current in operations of the multi-layer flexible electronic device 140.

In some implementations of the encapsulation processes (e.g., throughout the method 150 and/or after formation of the final layer of the circuit), for example, the encapsulation 136 can be designed such that each layer "n" is constrained to the dimensions of the underlying polymer backing in layer "n−1". As such, each subsequent layer pattern can be fabricated to the same footprint size or smaller than the preceding layer. If a circuit is designed in this fashion, then the method 150 may only include the encapsulation process to produce the encapsulation 136 after the formation of the final layer of the circuit, e.g., which can completely envelope the circuit layers before the peel-off step.

The method 150 includes the process 109 to produce a flexible multi-layer electronic device 140 by attaching the flexible substrate 118 to the formed multi-layer circuit 125 encapsulated in the encapsulation 136 on the processing substrate and detaching the multi-layer circuit 125 with the flexible substrate 118 attached thereto from the weakly-adhesive layer 112. The produced multi-layer flexible electronic device 140 includes the multi-layer circuit 125 attached to the flexible substrate 118.

FIG. 2A shows an illustrative diagram of an exemplary fabrication method 200 to produce a flexible electronic device, e.g., which is capable of being peeled off of a re-usable processing substrate. As shown in FIG. 2A, the method 200 includes the processes 101, 102, and 103 (or 201 and 103) to form the conductive layer 114 for a circuit to be fabricated using the processing substrate. The method 200 includes a process 205 to form the insulating layer 116 on the conductive layer 114, e.g., which attaches to the conductive layer 114 and can be applied uniformly on the conductive layer 114. In implementations of the process 205, for example, the insulating layer 116 can be formed over the conductive layer 114 without subsequent processing steps to pattern the insulating layer 116 at selection regions of the conductive layer 114. The method 200 includes a process 207 to form the circuit 120 on the processing substrate by a precision etching technique. In some implementations of the process 207, for example, laser etching can be performed to remove certain portions of the conductive layer 114 and overlaying insulating layer 116 while preserving selected portions of the conductive layer 114 and its overlaying insulating layer 116 to form components, interconnects, and/or other structural features of the circuit according to the circuit design or layout. In some embodiments, for example, the process 207 includes selecting the appropriate wavelength, power, and/or focal plane of the laser beam to be used in the laser etching for removal of the insulating layer 116 and the one or more layers of the conductive layer 114 individually, collectively, or in certain combinations. The method 200 includes the process 109 to produce the flexible electronic device 130 by attaching the flexible substrate 118 to the formed circuit 120 on the processing substrate and detaching the circuit 120 with the flexible substrate 118 attached thereto from the weakly-adhesive layer 112.

Figure 2B:
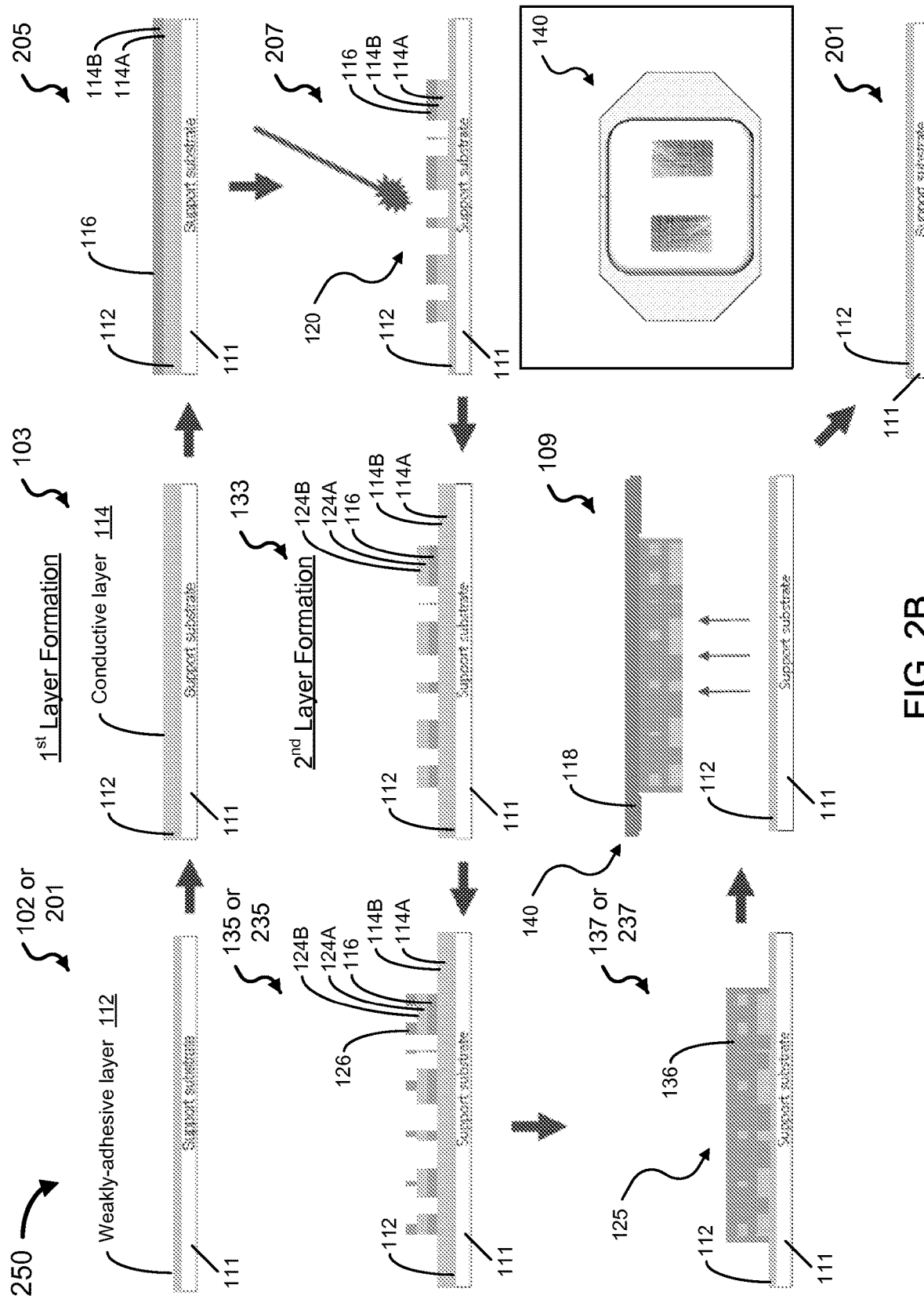

FIG. 2B shows an illustrative diagram of an exemplary fabrication method 250 to produce a multi-layer flexible electronic device, e.g., which capable of being peeled off of a re-usable processing substrate. As shown in FIG. 2B, the method 250 includes the processes 102 or 201, 103, 205, and 207 to form the first layer of the circuit 120 on the processing substrate, and the processes 133, 135 (or the process 205 adapted for the second circuit layer), and 137 (or the process 207 adapted for the second circuit layer) to form the second layer of the circuit 125 on the processing substrate. For example, the method 250 can include the process 205 to form the second insulating layer 126 on the second conductive layer 124, e.g., which attaches to the second conductive layer 124 and can be applied uniformly on the second conductive layer 124 (not shown in FIG. 2B); and subsequently, the method 250 can include the process 207 to form the multi-layer circuit 125 on the processing substrate by using a precision etching technique (e.g., laser etching) to remove certain portions of the second conductive layer 124 and overlaying second insulating layer 126 while preserving selected portions of the second conductive layer 124 and its overlaying insulating layer 126 to form components, interconnects, and/or other structural features of the circuit according to the circuit design or layout (and, for example, while also preserving the formed first layer of the circuit). For example, implementation of the process 207 in the method 250 can include selecting the appropriate wavelength, power, and/or focal plane of the laser beam and applying the laser beam to the predetermined x-,y-,z-coordinates to precisely etch the desired portions of the second conductive layer 124 and second insulating layer 216 without affecting the first conductive layer 114 and the first insulating layer 116. The process 137 implemented in the method 250 includes forming the encapsulation 136 of the multi-layer circuit 125, e.g., in which the type of encapsulation can be performed based on the subsequent processing. The method 250 includes the process 109 to produce the flexible multi-layer electronic device 140 by attaching the flexible substrate 118 to the formed multi-layer circuit 125 encapsulated in the encapsulation 136 on the processing substrate and detaching the multi-layer circuit 125 with the flexible substrate 118 attached thereto from the weakly-adhesive layer 112.

Recyclability of the processing substrate is possible in both wet and laser etching methodologies. For example, with laser etching, there is the possibility of also etching the underlying weak adhesion layer of the processing substrate, thereby disallowing recyclability of that substrate. The occurrence of this is governed by the manner in which one chooses to laser etch. One can carefully process such that although some areas of the recycled weak adhesion layer are altered or damaged, the alignment of the same pattern features to the untouched areas can result in a successful process. Moreover, laser etching of materials depends largely on the laser wavelength used to etch. Some wavelengths are absorbed by some materials and transmitted by others. In this case, it is possible to control etching not only by specifying a focal plane, but by etching layers using appropriate laser wavelengths, keeping in mind what remains underneath. In doing so, a layer-by-layer laser etching protocol can be used to ensure that certain layers (including the weak adhesion layer) are preserved during processing.

Figure 3:
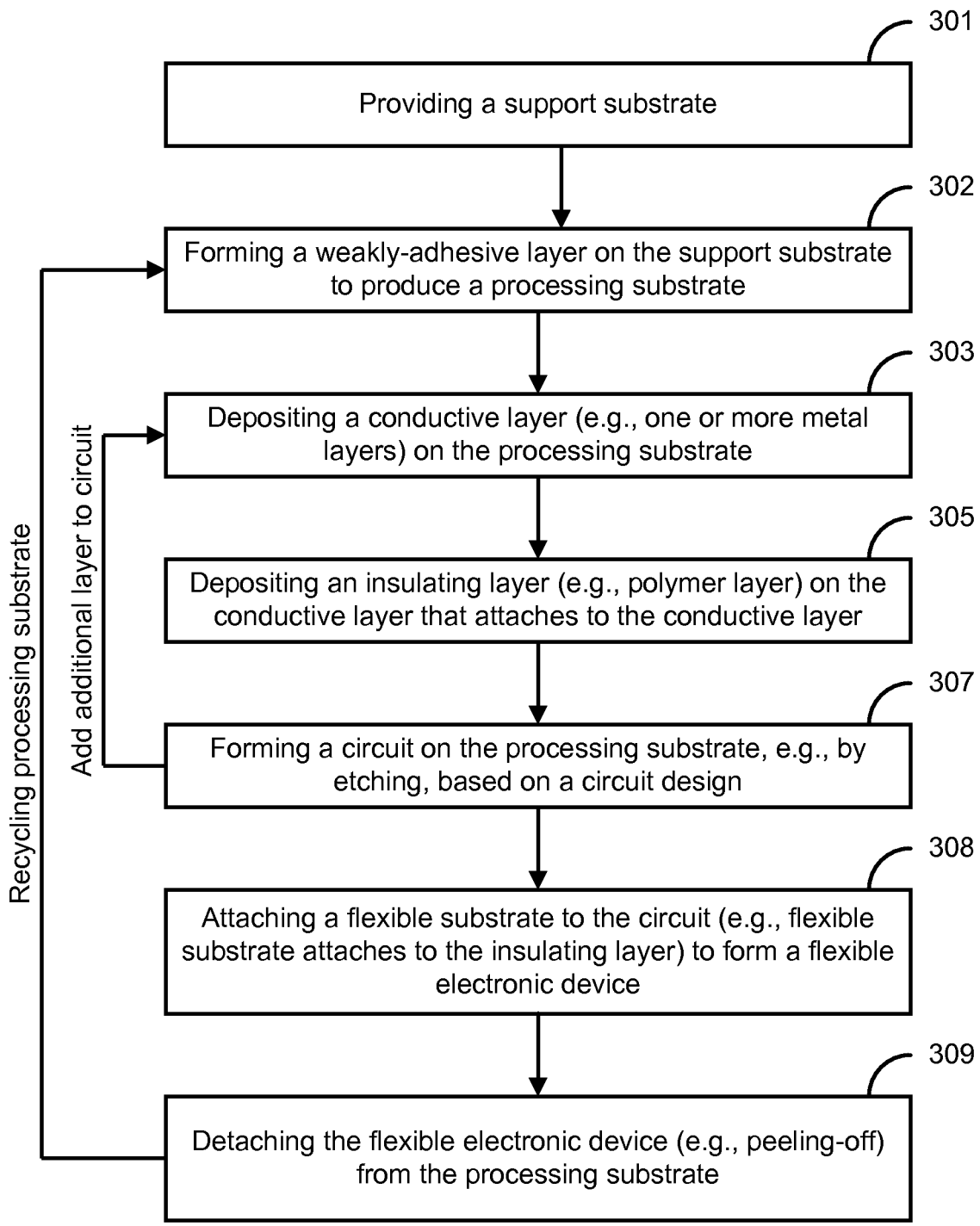
FIG. 3 shows a flow diagram of an exemplary fabrication method to produce flexible electronic devices.

FIG. 3 shows a flow diagram of an exemplary fabrication method to produce flexible circuits and devices. The method includes a process 301 to provide a support substrate for fabrication of flexible electric or electronic circuits, devices, and/or systems. The method includes a process 302 to form a weakly-adhesive layer on the support substrate to produce a processing substrate, e.g., which his reusable in additional implementations of the disclosed fabrication method. For example, the weakly-adhesive layer provides an interface layer for the processing substrate to facilitate an inverted fabrication process of the conductive portions of the circuit and facile detachment of the flexible circuit from the interface layer. The method includes a process 303 to deposit an electrically conductive layer (e.g., a metal layer or a plurality of metal layers) on the weakly-adhesive layer of the processing substrate. The method includes a process 305 to deposit an insulating layer (e.g., polymer layer) on the conductive layer that attaches to the conductive layer. In some implementations of the process 305, for example, a photo-definable polymer layer is formed and patterned on the metal layer, which can be used as a support and also an etching mask. In some implementations of the process 305, for example, a polymer backbone is deposited and cured (without a pattern) for subsequent precision etching, e.g., laser etching. The method includes a process 307 to form a circuit on the processing substrate, e.g., by etching, based on a circuit design. In some implementations of the process 307, for example, the metal layer is etched using the photo-definable polymer layer as a mask through wet etching; whereas in other examples, the metal layer and polymer backbone layer are etched to form the circuit features using laser etching. The method includes a process 308 to attach a flexible substrate to the circuit (e.g., flexible substrate attaches to the insulating layer) to form a flexible electronic device. The method includes a process 309 to detach the flexible electronic device (e.g., peeling-off) from the processing substrate. In some implementations of the method, for example, the method can include recycling the processing substrate after the process 309 for use in an implementation of the process 302 for production of another flexible electronic circuit and/or device. In some implementations of the method, for example, the method can include repeating the processes 305, 307, and 309 to produce an additional circuit layer for the flexible electronic circuit and/or device.

The disclosed technology can be implemented in ways that require less procedures and/or materials in comparison with some other fabrication methods, and therefore provides multiple benefits. The yield (e.g. probability of success) of the product is increased by the illustrated method compared to conventional ones. As a result, the expected number of "runs" to complete a required number of flexible circuits is decreased, saving both time and materials costs. Moreover, within any individual run, the number of procedures and/or materials used by the exemplary method is less than that required by the existing conventional methods. In addition, the disclosed fabrication methods are compatible with, but not limited to, e.g., roll-to-roll printing of flexible circuits. Therefore, the disclosed fabrication methods are capable of providing desired and unmodified product features in a manner that can be easily automated for mature industrial production. The disclosed fabrication methods can be utilized for industrial production of flexible electronics for a variety of fields including, but not limited to, e.g., medicine, engineering, and consumer products. The disclosed fabrication methods can be used for any situation requiring acquisition and/or facilitation of electrical, optical, chemical, mechanical signals. Examples of this include, but not limited to, e.g., sensors for physiological signals and inanimate objects, microfluidic devices, devices for cellular research, devices for defense and security.

Exemplary Implementations of the Disclosed Fabrication Methods

Exemplary implementations of the disclosed fabrication methods were performed that demonstrate some of advantages of the present technology including faster, lower-cost production of ultrathin flexible electronic circuits and devices on adhesives, e.g., including an exemplary adhesive-peeled (AP) flexible sensor device. For example, with significant technological advances in the realms of wearable and industrial sensors and circuits, the disclosed fabrication methods provide optimal techniques for which production of such technologies is commensurate with their current and projected commercial demands. Keeping pace with these trends and demands will allow for increased production and dissemination of flexible electronics technology.

Flexible electronics devices and systems (e.g., bendable and stretchable) can include sensors and circuitry that are increasingly deemed relevant to the future of industrial and consumer electronics devices. The evolution of bulky and rigid electronics into desired thin and unobstrusive counterparts has required innovative techniques going beyond standard implementations of CMOS microfabrication. Some approaches have included screen-printing techniques or engineering of new materials, but such approaches lack the capability to achieve low-cost, large scalability, and full and facile integration of electronics with ultra-thin profiles. For example, typical conventional methods utilize sacrificial layers (e.g., poly(methylmethacrylate) (PMMA), Silicon (Si)) and intermediate substrates (e.g., polydimethylsiloxane (PDMS)) for transfer printing, e.g., which have allowed for nanomembranes with mechanically-tuned properties. For example, epidermal electronics systems boast ultra-thin, high resolution, "skin-like" sensors and circuitry designed for conformal lamination onto the skin. While such systems present many significant advances for mobile technologies, the manner in which they are currently fabricated requires intermediate materials, and suffers from poor precision involved in transfer printing necessary to produce high yields.

As modern society becomes a more networked society, in particular through the Internet of Things (IoT), the demand for tomorrow's inconspicuous sensors is quickly rising. This is exemplified by the five-fold increase in sensors from 2012, resulting over 20 billion sensors by 2014. These numbers are accompanied by the high cost and complexity of fabricating minimally obtrusive sensors, which proves to be a barrier for widespread adoption of IoT practices in spaces such as healthcare, home, and industrial use.

The disclosed microfabrication methods of the present technology are capable of producing such flexible devices and systems in higher-yield and lower-cost production. The exemplary implementations of an example fabrication method of the present technology demonstrated the use of a weak-adhering interface and inverted fabrication scheme, in which the disclosed technology obviates the need of a sacrificial layer or intermediate transfer printing and allows for direct integration of the fabricated device (e.g., flexible sensor) from the donor substrate to a target receiving adhesive. As shown by the example results of the exemplary implementations, resulting adhesive-peeled (AP) sensors produced using the disclosed technology were used to record electrophysiological signals comparable to those produced by conventional methods (e.g., transfer printed (TP) approach), e.g., demonstrating similar sensor fidelity and showing that the exemplary peel-off technique is capable of industry-scale roll-to-roll post-processing.

In the exemplary implementations described in this patent document, a sensor of pre-specified geometry to be embedded within a given adhesive is produced using the disclosed technology and a conventional method (e.g., TP technique). It is shown that the same sensor can be made more easily and with higher yield. To differentiate the two in this discussion, sensors produced by the TP technique are designated as "TP sensors", and the exemplary sensors produced by the disclosed technology are designated as "AP sensors".

Figure 4A:
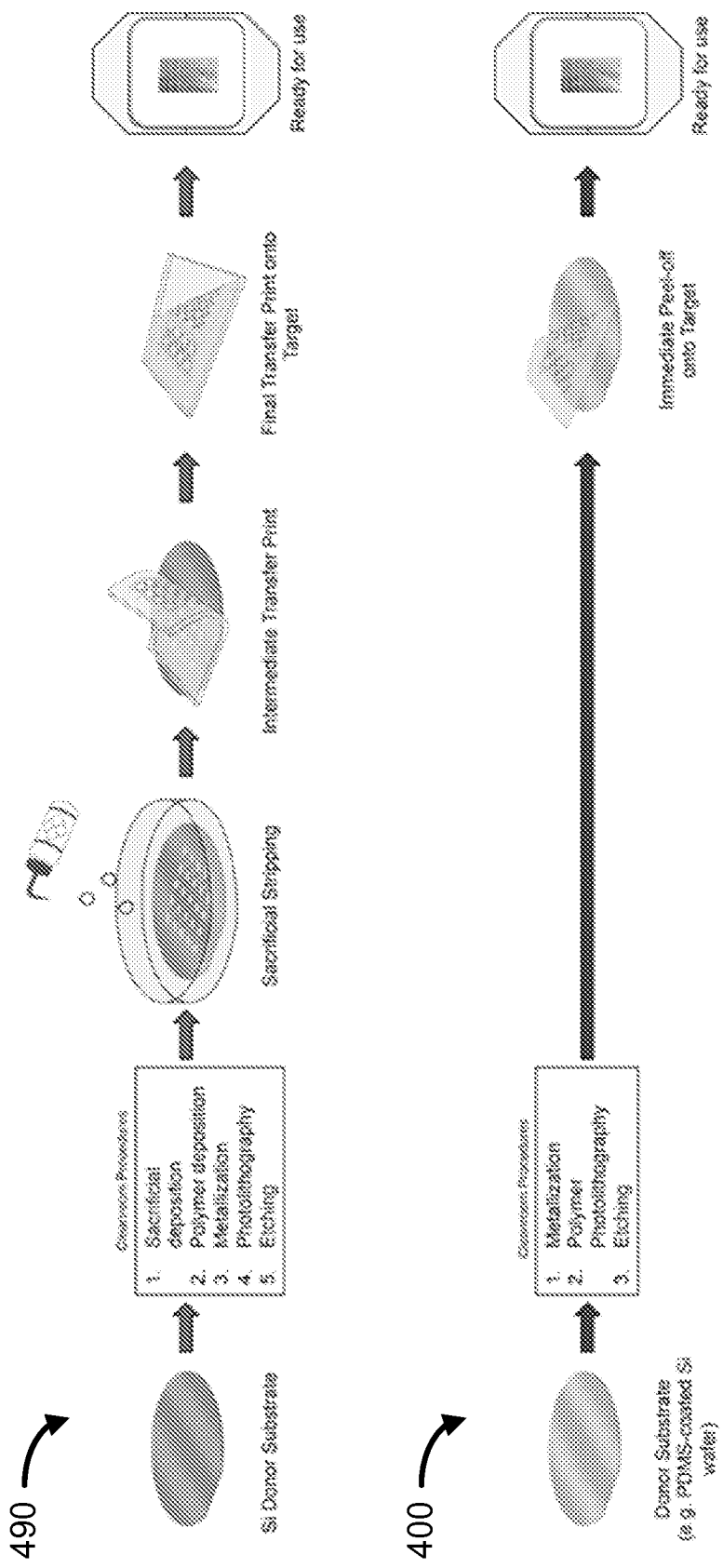
FIG. 4A shows an illustration depicting a conventional transfer printing (TP) fabrication technique and an exemplary fabrication technique of the present technology to produce flexible sensor devices.

FIG. 4A shows an illustration depicting the TP technique and an example fabrication technique of the present technology to produce the AP sensors, e.g., which may be referred to as the AP technique or process. As shown in FIG. 4A, the TP technique 490 begins with a donor substrate and undergoes a string of standard cleanroom procedures, which includes depositing a "sacrificial layer" (e.g., PMMA), formation of a polymer backbone, deposition of metal layers, photolithography for formation of a wet etch mask and subsequent wet etching and dry etching techniques (and in many cases, dicing of the support wafer). The donor substrate then is dipped in solvent (e.g., acetone) that dissolves the sacrificial layer and separates the carrier substrate from the other deposited materials. Subsequently, two transferring steps ensue through which the desired pattern is delivered to an intermediate transfer material (e.g., PDMS), and then upon pressure, finally onto a target receiving substrate. For example, the dissolution of the sacrificial layer and transferring steps typically require experienced training to perform successfully. The TP technique 490 culminates in an adhesive with a patterned metal-polymer stack ready for use.

As shown in FIG. 4A, the AP technique 400 obviates the need for depositing a sacrificial layer or intermediate transfer printing and allows for direct application of the adhesive onto the donor substrate to embed the pattern on or within a flexible substrate. The AP technique 400 includes using a weak adhesion layer on a donor substrate so that peel-off is performed directly by an adhesive flexible substrate. The AP technique 400 reduces the amount of processing steps and accomplishes direct transfer of the circuit to the adhesive flexible substrate, e.g., through the use of: 1) a weak-adhering donor substrate and 2) inverted production of the metal-polymer stacks. For example, both techniques 400 and 490 result in the same sensor embedded on/within the adhesive flexible substrate, but with the AP technique 400 requiring fewer steps and materials.

Figure 4B:
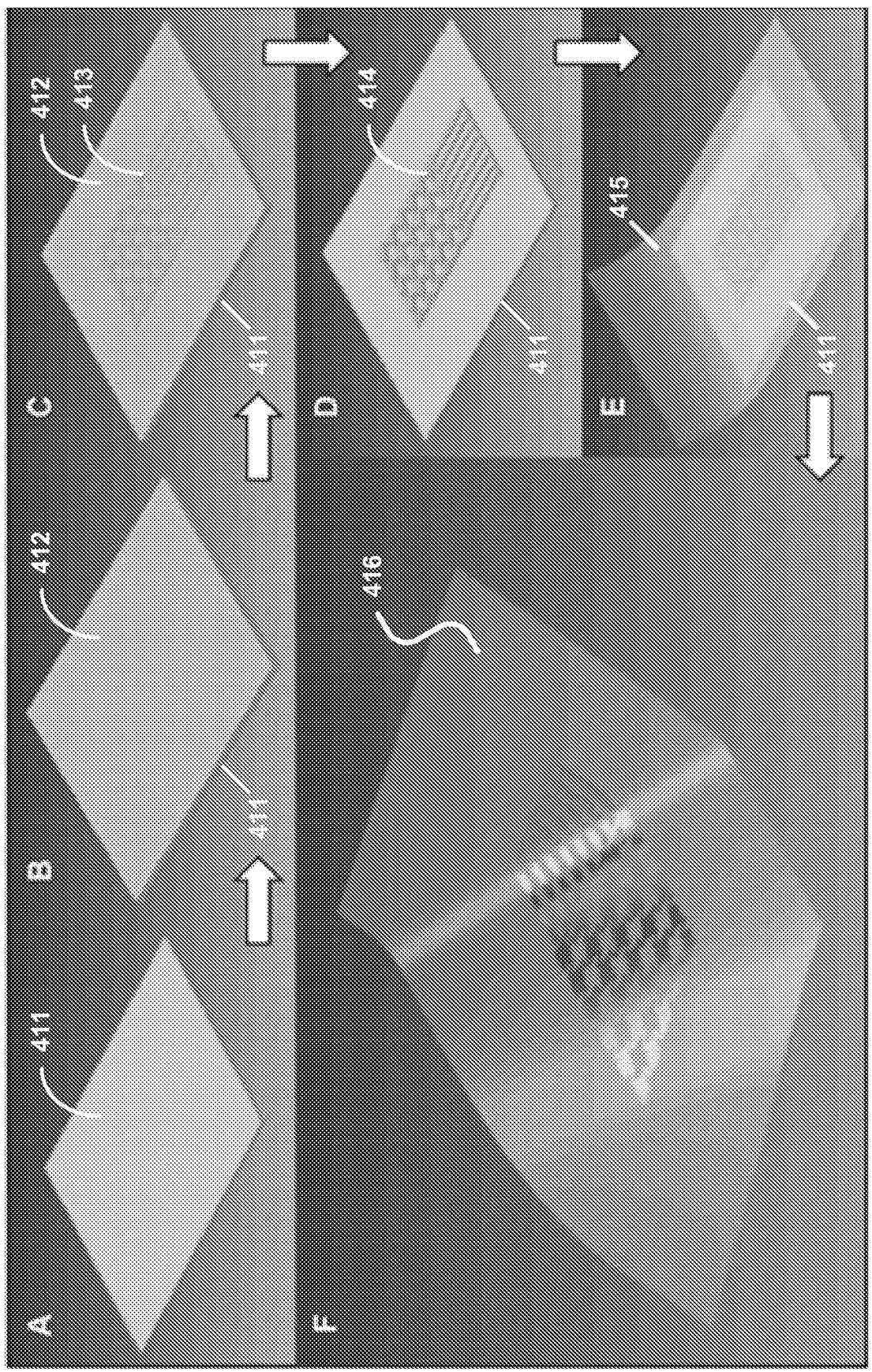
FIG. 4B shows an illustrative diagram of an exemplary fabrication technique to produce adhesive-peeled (AP) sensors.

FIG. 4B shows an illustrative diagram of an exemplary fabrication technique to produce adhesive-peeled (AP) sensors. In the example shown in FIG. 4B, a standard Si wafer was coated with a thin silicone layer (e.g., PDMS), creating a weak-adhering interface layer of an exemplary PDMS-Si processing substrate 411, as shown in panel A of FIG. 4B. Microfabrication techniques were applied in a semi-reversed order for creating inverted the flexible AP sensors on the process substrate 411. Sequential metallization of gold (Au) and chromium (Cr) thin films 412 were deposited onto the PDMS interface layer to form the conductive layer of these sensors, as shown in panel B of FIG. 4B. The Au thin film interfaces with the PDMS interface layer while Cr is exposed. A photodefinable polyimide (PPI) was then used for simultaneous formation and patterning of the sensor's polymer backing, in which the patterned PPI layer 413 is shown in panel C of FIG. 4B. An etch-back of the exposed Cr—Au regions was created (e.g., shown as inverted circuit 414 in panel D of FIG. 4B) on the processing substrate 411 to produce AP sensors 416, which can be can be directly peeled-off by an adhesive flexible substrate 415 of choice, as shown in panels E and F of FIG. 4B.

Figure 5A:
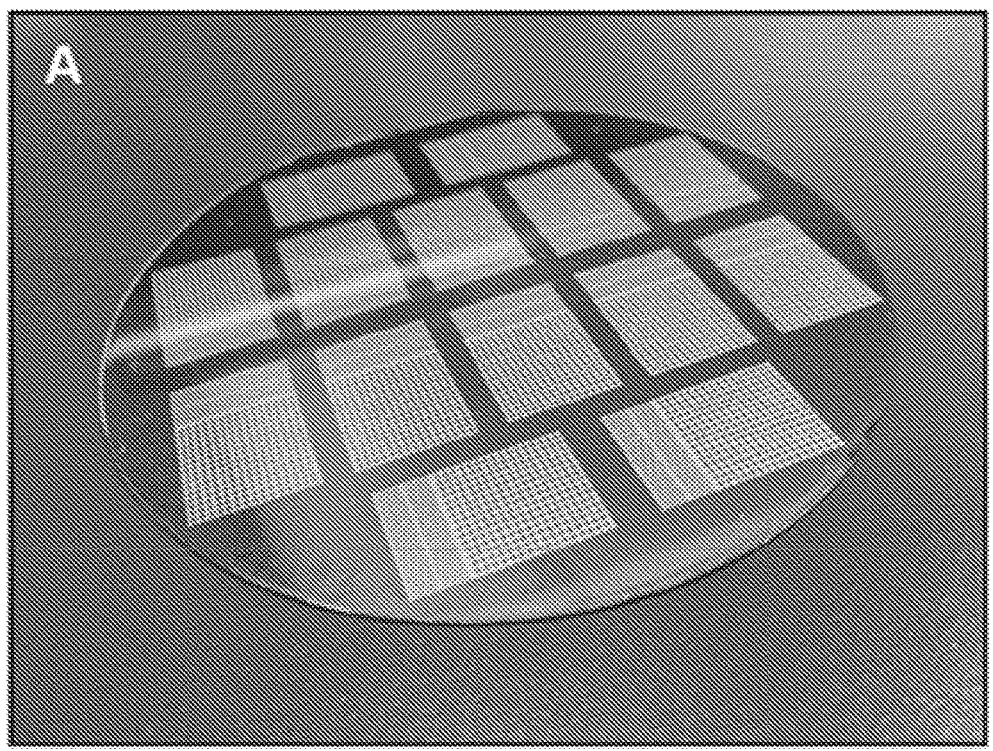
FIGS. 5A and 5B show images of exemplary flexible electrical sensors fabricated using an exemplary fabrication technique of the disclosed technology.
Figure 5B:
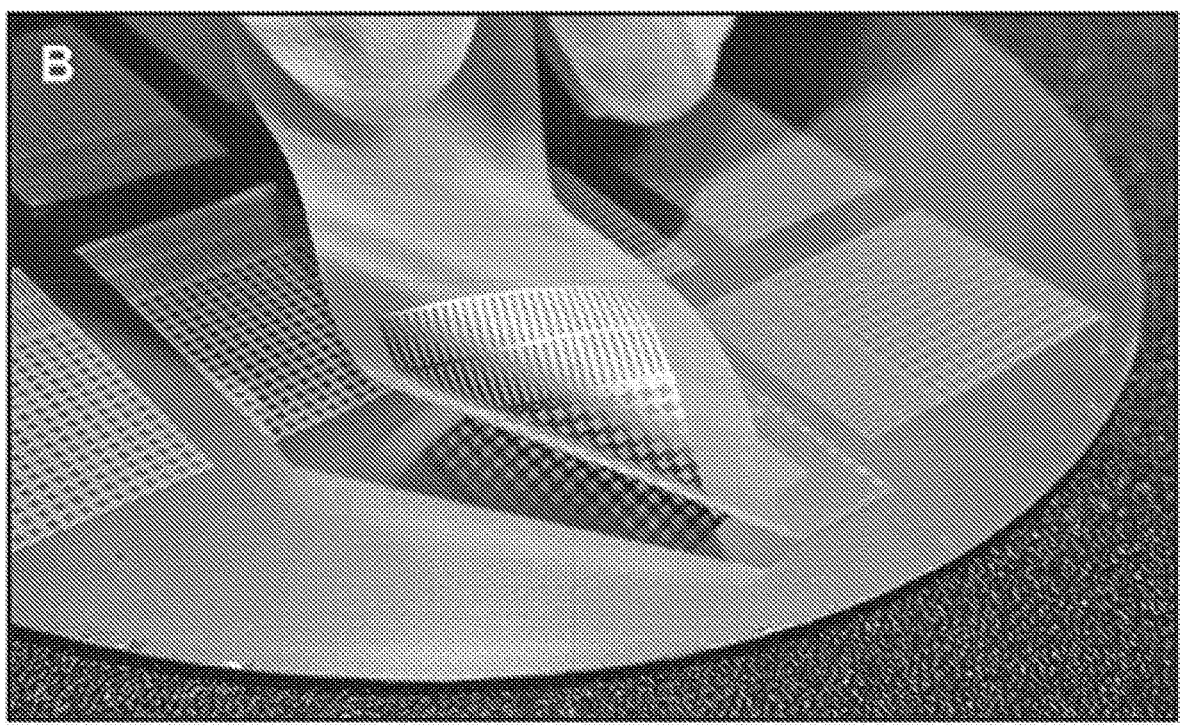

The exemplary implementations included a qualitative comparison of the example TP and AP fabrication techniques to produce the flexible sensors. FIGS. 5A and 5B show images of exemplary flexible electrical sensors fabricated using the exemplary AP technique. As shown in the image of FIG. 5A, the exemplary AP sensors can be densely packed onto the same working area of the donor processing substrate, e.g., since submersion in the solvent and wafer dicing are no longer necessary. FIG. 5B shows an image demonstrating the ease with which a sensor device can be peeled-off onto an adhesive material (e.g., Scotch Tape). For example, with the AP approach, the desired pattern can be fabricated and objectively post-processed onto a receiving adhesive of choice with a one-step peel-off, obviating the need for solvents and intermediate stamps. To further demonstrate this—and the possibility of roll-to-roll post-processing—the exemplary implementations included peeling off fabricated AP sensors with a consumer-grade lint roller from the processing substrate. For example, the force to successfully peel-off AP sensors from the exemplary PDMS-Si donor processing substrate was calculated at 0.22±0.03 N.

In contrast, TP sensors are subject to a lengthy release process involving sacrificial layer stripping via solvent treatment, after which a TP sensor undergoes a two-step transfer printing process, e.g. involving a sacrificial layer such as PMMA, solvent such as acetone, and transfer stamp such as PDMS. The requirement of controlled pattern release rates from the donor substrate during sacrificial stripping can often lead to sensors that are deformed from the intended design. These challenges are only magnified when considering larger, more complex heterogeneous sensor patterns, often requiring subjective user judgment and manual dexterity.

Figure 6:
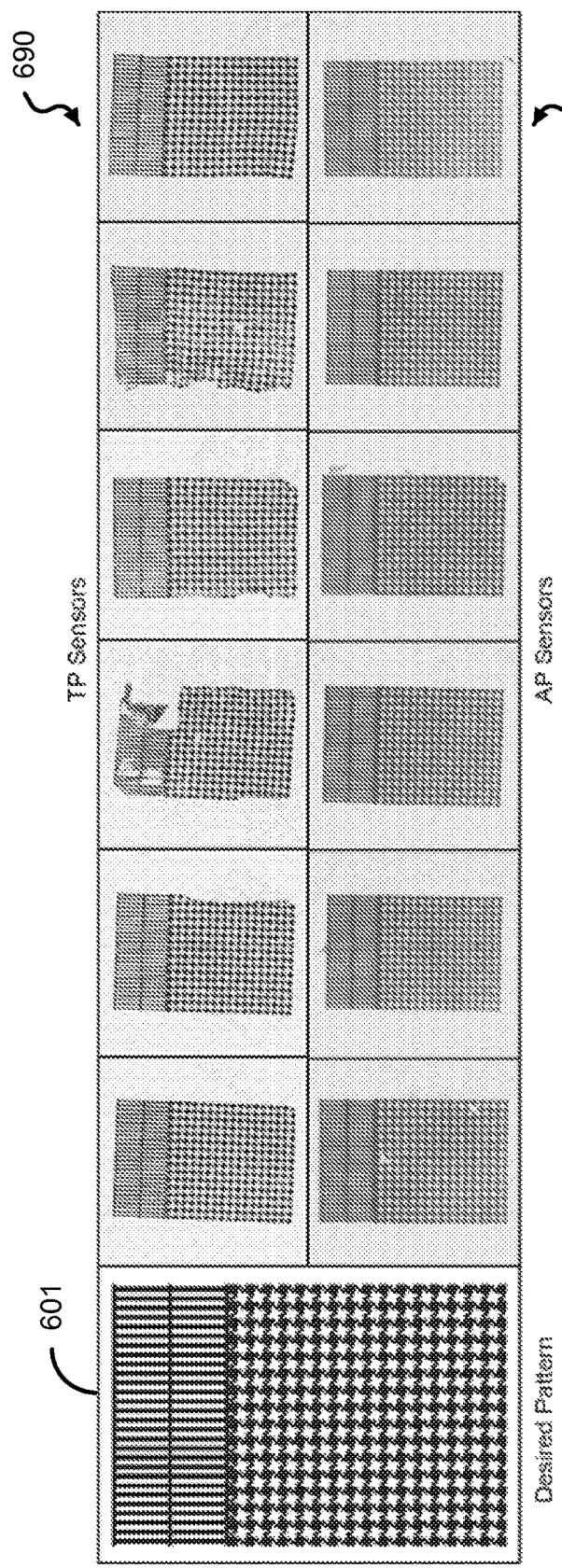
FIG. 6 shows a montage of exemplary processed sensor devices using a conventional TP technique and an exemplary fabrication technique of the disclosed technology.

FIG. 6 shows a montage of consecutively processed sensor devices using the conventional TP technique and the exemplary AP technique, which demonstrates significant pattern variability of the TP sensors produced using the conventional TP techniques, while the AP sensors demonstrated consistent and robust pattern as designed. Although it is possible with the TP approach to retrieve sensors identical to the desired pattern, this requires considerable time and expertise, which translates to higher costs associated with yield. When time and/or expertise are unavailable, it is easy to end up with a torn and unusable sensor, as shown in row 690 of FIG. 6. By comparison, for example, the exemplary AP technique provided flexible sensors accurate to the desired pattern 601 with no or insubstantial deformity across several samples, as shown in row 610 of FIG. 6. Also, for example, comparing both methods, there is an approximately 50% reduction in processing time using the AP technique with respect to the conventional TP technique. Moreover, the 50% reduction in processing time of the AP technique is accompanied by the improved yield over the conventional TP technique, in which the AP technique further reduces intentional redundancies in the production of these sensors and may furthermore improve through automated processes. Though automation has been demonstrated for TP production of thin film silicon-based electronics, these systems require high precision, multi-point calibration, and visual inspection of transfer printing to ensure high yield post-processing. Because the AP technique requires fewer procedures, does not require sacrificial stripping or undercutting, and is not subject to the variability in release rates, the AP technique is capable of automated post-processing of AP sensors.

Figure 7B:
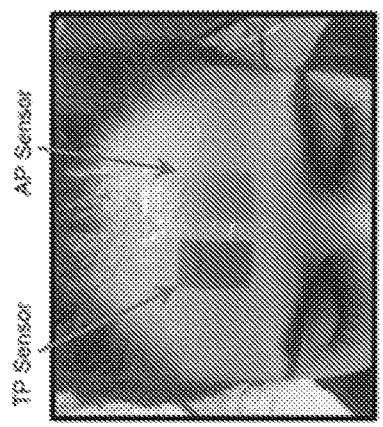
FIGS. 7A-7E show images and data plots of an exemplary electrophysiological implementation using TP and AP sensors.
Figure 7A:
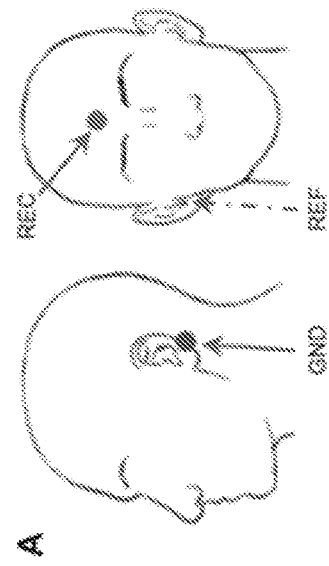
Figure 7C:
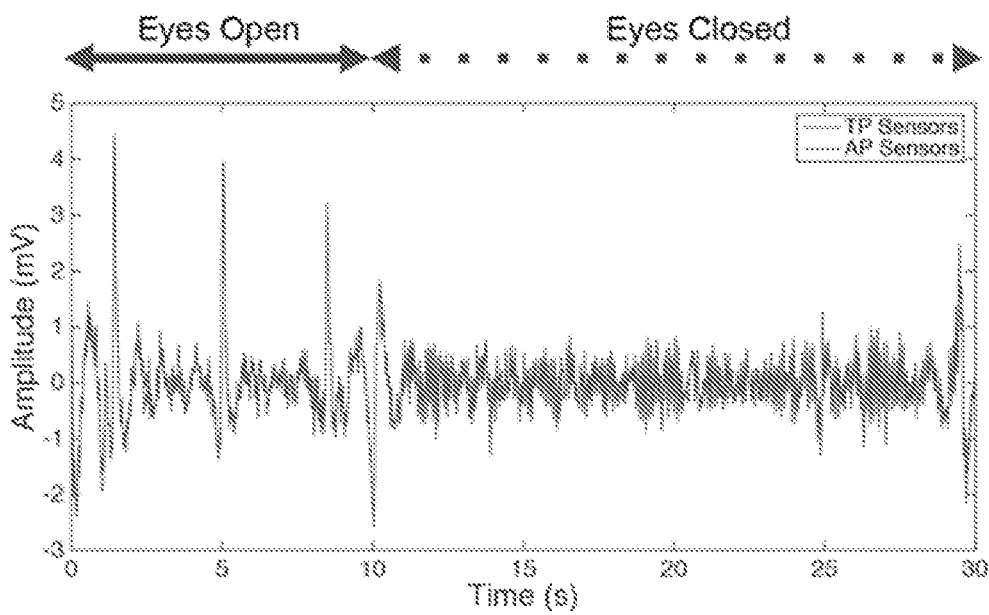
Figure 7D:
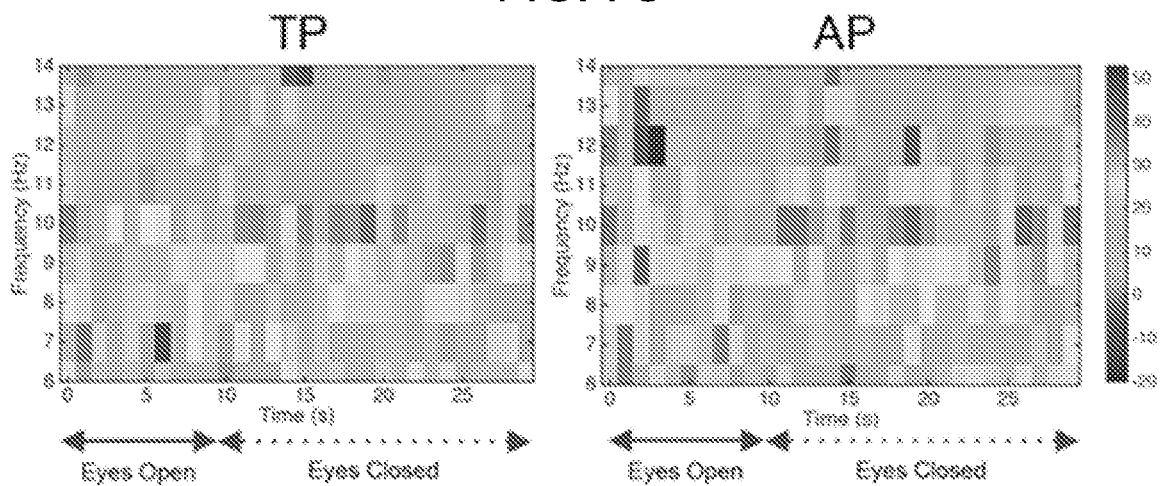

The exemplary implementations included a quantitative comparison of the example TP and AP fabrication techniques to produce the flexible sensors. For example, to ensure functional characteristics of the sensors are preserved when fabricating with the exemplary AP approach, a common eyes-opened/eyes-closed paradigm for measurement of the 8-12 Hz alpha rhythm in electroencephalogram (EEG) was performed. An EEG test was chosen to demonstrate that AP sensors can adequately measure lower amplitude-frequency signals, while indirectly demonstrating that larger biopotentials such as ECG and EMG can be easily measured with high fidelity. For example, this is especially true due to gold's low impedance in high-frequency bands, as compared to bands characteristic of EEG signals. A set of the example AP and TP sensors on Tegaderm flexible substrates were connected to custom flex cabling and applied in a 3-lead mastoid configuration, as shown in FIG. 7A. Each set included recording (e.g., REC, forehead), reference (e.g., REF, right mastoid process), and ground (e.g., GND, left mastoid process) leads. Sensors were carefully arranged side-by-side so to prevent electrical cross-talk between channels, as shown in FIG. 7B. The AP and TP sets were wired into an Avatar EEG biopotential amplifier system, and EEG data was simultaneously recorded from both sensor sets. The acquired biopotential data was sampled at 500 Hz and digitally band-passed in Matlab to a 6-14 Hz spectral range. FIGS. 7C and 7D show voltage and time-frequency representations of the exemplary data from both AP and TP sensor sets. For example, time-frequency plots were generated using the robust spectrotemporal decomposition. In both representations, the first 10 s of data are eyes-opened followed by 20 s of eyes-closed data, which is characterized by a 10-12 Hz alpha rhythm (e.g., the alpha rhythm begins just after the 10 s mark for both sensors). The data plots of FIGS. 7C and 7D confirm that EEG data from both sensor types co-vary closely with one another. This suggests that the disclosed microfabrication techniques have no significantly negative effect on the acquisition capability of such sensors.

Furthermore, for example, AP sensor fidelity was compared to that of TP sensors by use of the Pearson's correlation coefficient, which ranges from −1 to 1: where −1 being negatively correlated, 1 being positively correlated, and 0 representing no correlation.

$$r = \frac{\sum_{i=1}^{n}(X_i - \overline{X})(Y_i - \overline{Y})}{\sqrt{\sum_{i=1}^{n}(X_i - \overline{X})^2}\sqrt{\sum_{i=1}^{n}(Y_i - \overline{Y})^2}} \quad (1)$$

Figure 7E:
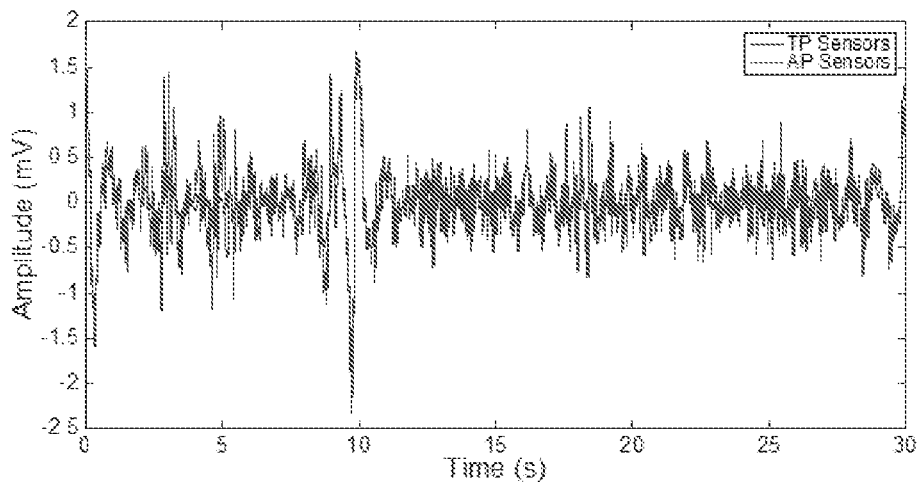

Equation 1 is used to calculate the r statistic for each TP-AP pair of simultaneously recorded voltage data. Table 1 lists correlation coefficients for each of the six TP-AP trials. Many of trials resulted in similar PMMA and AP time series (r>95%), suggestive of AP sensors' high fidelity acquisition despite alternative fabrication procedures. It is noted that perfect correlation was not possible in these exemplary implementations, for example, in that both sensors record nuances in thermal noise and motion artifact at the sight of signal acquisition. For example, one trial resulted in two relatively dissimilar signals, yielding a relatively low correlation (e.g., subject 3, trial 2, r=81%). FIG. 7E shows data for the exemplary deviant correlation coefficient (e.g., subject 3, trial 2), in which the TP sensor waveform presented more noise than that of the AP sensor. The exemplary data demonstrates that the TP time series presents more noise than its AP counterpart, e.g., causing deviation during comparison and the low correlation.

TABLE 1

Pearson's correlation coefficients for EEG testing, e.g., TP-AP EEG test comparisons.

| Subject | Trial | Correlation Coefficient |
| --- | --- | --- |
| 1 | 1 | 0.95 |
|  | 2 | 0.95 |
| 2 | 1 | 0.98 |
|  | 2 | 0.96 |
| 3 | 1 | 0.95 |
|  | 2 | 0.81 |

Figure 8A:
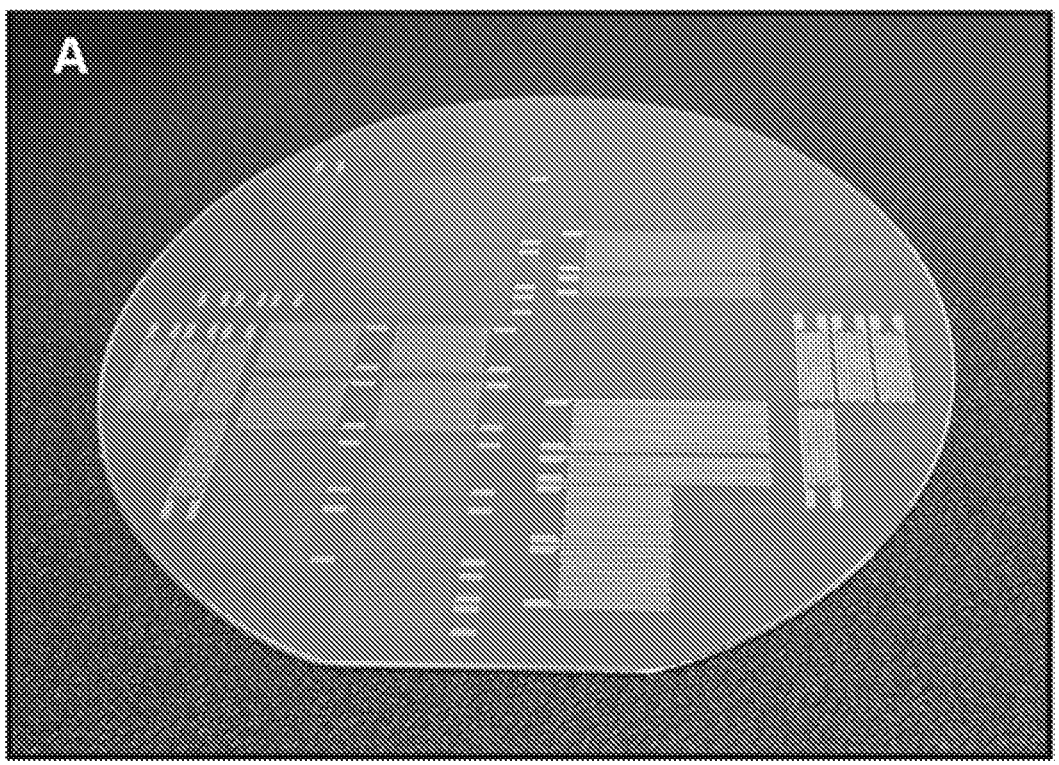
FIGS. 8A and 8B show images and a data plot of exemplary AP strain sensors.
Figure 8B:
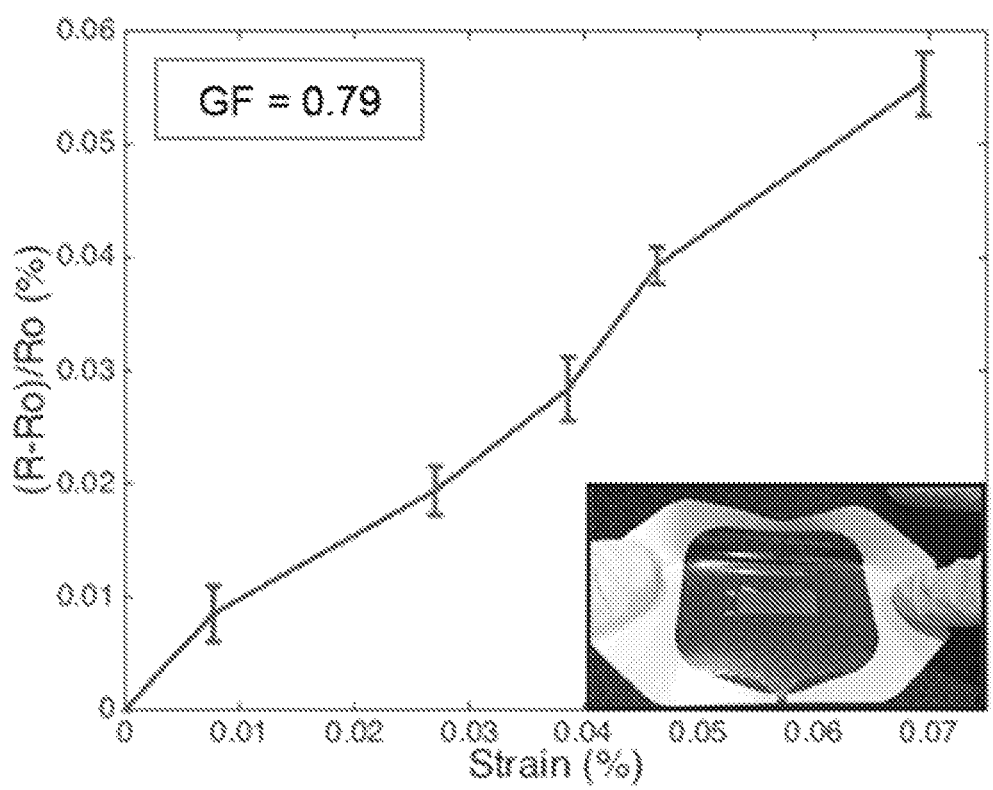

Using the exemplary AP fabrication technique, other sensor types can be easily fabricated for monitoring through other modalities. For example, an instance of this is the production of a variety of simple strain sensors. FIG. 8A shows an image showing exemplary AP strain sensors on a wafer. FIG. 8B shows a data plot depicting characteristics of the exemplary AP strain sensors, in which the inset of FIG. 8B shows an image of an exemplary AP strain sensor stretched during testing, e.g., gauge factor (GF)=0.79. The exemplary AP strain sensors were fabricated according to the same framework described in FIG. 4B, e.g., in which the pattern used during photolithography was replaced by the desired pattern to produce a variety of functional strain sensors with tailored gauge factors. Post-processing of these sensors followed the same peel-off process—from the donor substrate onto the receiving adhesive of choice. The axial strain-resistance performance of one AP strain sensor over several trials is illustrated in FIG. 8B, and its gauge factor (GF) calculated. With a GF of 0.79, the particular gold strain sensors in this exemplary implementation demonstrated relatively poor sensitivity to mechanical stimuli, as compared to other strain gauge varieties; but, the AP fabrication technique offer versatility in the types of sensors that can be produced, and one in which optimizations can be made.

Figure 9A:
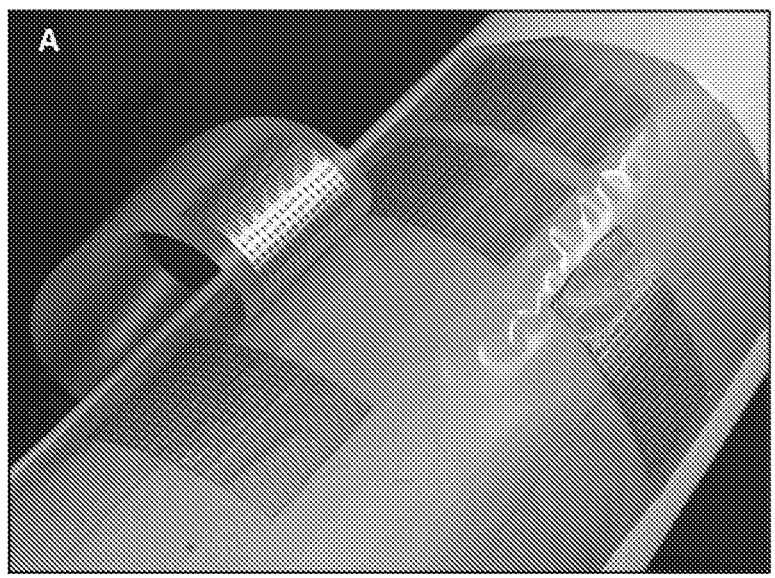
FIGS. 9A-9C show images of exemplary AP sensors produced with a flexible support substrate, e.g., for roll-to-roll processing, and a data plot of results acquired using an exemplary EKG AP sensor off a flexible donor substrate.
Figure 9B:
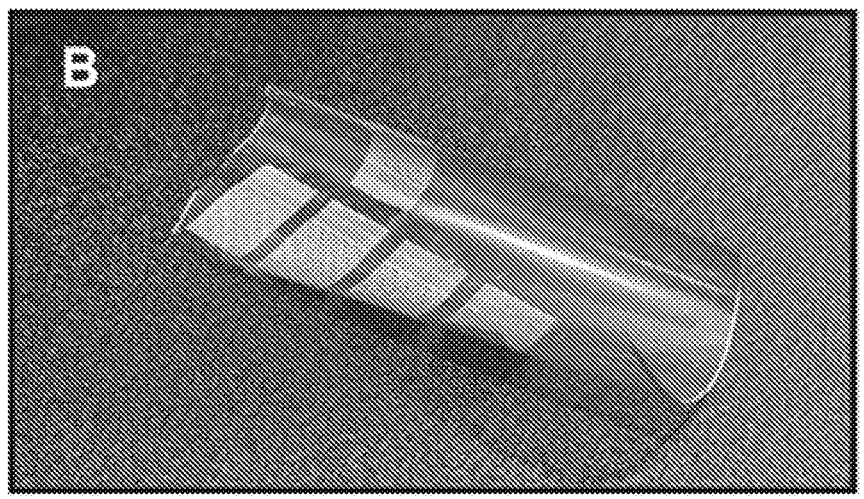
Figure 9C:
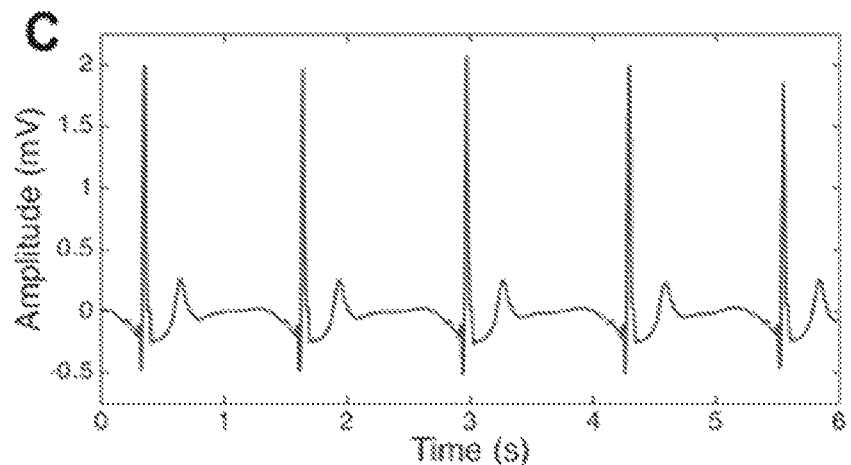

The exemplary implementations included producing AP sensors on flexible donor substrate with roll-to-roll post processing techniques. For example, the simple peel-off properties of the exemplary AP fabrication technique allows fabrication on flexible donor processing substrates, which enables the use case of roll-to-roll post-processing. For example, instead of a rigid support substrate (e.g., silicon wafer), Kapton film was used to fabricate AP sensors, e.g., which utilized the same technique as shown in FIG. 4B. FIGS. 9A-9C show images of exemplary AP sensors produced with a flexible support substrate, e.g., for roll-to-roll processing, and a data plot of results acquired using an exemplary EKG AP sensor off a flexible donor substrate. FIG. 9A shows an image of an exemplary AP sensors half-peeled by consumer tape with the flexible donor substrate (e.g., Kapton film) mounted on a tube. FIG. 9B shows an image of a free-standing flexible donor processing substrate with the AP sensors. In the exemplary implementations, a peel-off process of the fabricated AP sensors on the flexible substrate from the exemplary flexible Kapton-PDMS donor processing substrate was performed. These exemplary AP sensors from flexible donor substrate showed no apparent differences as compared to their analogs from the exemplary rigid donor processing substrates. To demonstrate their function, a single-channel EKG implementation was performed. FIG. 9C shows a time-voltage plot of electrocardiogram (EKG) data acquired using an exemplary AP sensor off the flex donor, which shows a strong QRS complex alongside P and T waves. Using the disclosed technology, it is possible to insert a roll of AP sensors to existing tape manufacturer's production line (e.g., with some modifications), so that the AP sensors can be directly peeled directly onto the target adhesive and sent out to the end user.

Exemplary Materials.

In some of the exemplary implementations described, the following materials and procedures were used. For example, formation of the weak-adhering donor substrate was prepared by spin coating and curing a 50 µm thick layer of poly(dimethylsiloxane) (PDMS) onto a 4-inch silicon wafer (University Wafer, USA). Thin metal films were deposited on top of the PDMS surface using a sputter system (e.g., using ATC Orion, AJA, USA) to form Au and Cr metal layers (in this order) of 200 nm and 5 nm in the thicknesses, respectively. A negative-tone photodefinable polyimide (HD-4104, HD Microsystems, USA) was spin coated at 3,000 rpm for 1 min, soft baked (e.g., 150° C., 1 min), and UV-exposed (e.g., using EVG620, EV Group, Austria). The polyimide film was developed by using a modified puddle approach. The photodefined polyimide (resting on top of the wafer) was placed in a convection oven at 250° C. for 90 min to ensure full curing of the polyimide patterns and complete bonding to the interfacing Cr layer. The wafer was then dipped in Cr and Au etchants (in this order) to remove unnecessary metal surfaces, only leaving metal layers directly under the polyimide pattern intact. Completed devices were peeled onto the target receiving (e.g., flexible) substrate, e.g., such as Tegaderm™ (3M™, USA), by laminating the target adhesive film over the devices and delaminating once the device is adhered. In exemplary implementations for fabrication of AP sensors on a flex substrate, the same example method was followed, but using 25 μm Kapton® polyimide film (DuPont, USA) as the support substrate upon which the PDMS (or other weakly-adhesive layer, e.g., such as polyimide) was formed.

EEG & Statistical Testing.

Three subjects were each tested on two separate occasions for eyes-opened and eyes-closed EEG data, e.g., acquiring data from both PMMA and AP sensors. The exemplary procedures and conditions were explained to each subject, after which informed consent was obtained. The testing paradigm epoch was as follows: 10 s eyes-opened followed by 20 seconds eyes-closed. This process was repeated twice more (90 continuous seconds of EEG data, for a total of 3 epochs) to ensure data without deviant artifacts from the independent recording systems. Of these 3, the least noise prone epoch was chosen per subject, per trial—which resulted in a total of N=6 epochs of PMMA-AP EEG data from 3 subjects. Because both sensor sets were used simultaneously, each epoch included synchronized PMMA and AP biopotential data. Data sets were then post-processed to yield Pearson's Correlation coefficient values for evaluation of similarity between PMMA and AP sensor performance.

Peel Testing—Initial Interfacial Characterization.

An array of equally spaced, 1 cm×1 cm solid square patterns were fabricated onto a weak-adhering donor substrate as outlined. Peel-off force were measured using a force gauge (e.g., M2-2, Mark-1, USA), rigidly coupled to a flat mount lined with adhesive tape. The adhesive end was adhered only to the full 1 cm² pattern area and the force gauge pulled upwards, normal to the pattern plane. Maximum force observed during this peel-off was used to characterize the adhesion force between the PDMS-sensor interface. The process was repeated 5 times, at random positions on the donor substrate. Peel force average and variance were calculated using the data.

The results of the exemplary implementations described above show that the disclosed technology can be used to effectively produce flexible sensors and other flexible electronic circuits, devices, and systems, which can also be post-processed in a relatively efficient and cost-effective manner. For example, roll-to-roll processing is a ubiquitously used industrial process, which boasts efficiency at the levels of cost and automation. Rather than "re-invent the wheel" for accommodating these growing spaces, the disclosed fabrication methods can seamlessly integrate into mature processing techniques such as roll-to-roll, e.g., at the stage of post-processing and packaging. Also, for example, AP sensors can be designed as single-use, peel-and-stick sensors for use in the arena of clinical patient monitoring, e.g., where disposable systems are preferred due to concerns of sterility and contamination, as well as more generally in the spaces of consumer and industrial sensing that benefit from single-use flexible form factors.

Also, for example, the weakly adhesive material can be selected from any adhesive or adhesive-coated material that can effectively adhere to the desired pattern (e.g., for the Si-PDMS donor processing substrate example, with an adhesive force approximately >0.2N) that is likely to perform a successful peel-off of the final flexible electronics device during post-processing. Moreover, knowledge of the range of forces necessary for successful peel-off allows one to consider situations where one might initially constrain the adhesive to be used and "reverse engineer" the adhesion force between PDMS and Au films. For example, if certain types of strong adhesives cannot be used due to their damaging of a target surface (e.g., application on neonates with sensitive skin), there is opportunity to tailor the PDMS-sensor interface. In doing so, one can decrease the interface adhesion for facilitating peel-off with weaker adhesive material, while maintaining AP sensor stationarity during microfabrication. Also, for example, the electrically conductive material can be selected from other metals such as silver (Ag) considering the interfacial adhesion of the conductive material with the interface layer. For example, Ag can be post-processed for yielding Ag/AgCl (e.g., one of the best suited for DC coupled signal acquisition) and Pt AP sensors (e.g., used for its long-term stability and biocompatibility in vivo; standard practice in neural stimulation).

Moreover, integrated systems of flexible electronic devices (e.g., AP sensors) with miniaturized back-end transmission and processing circuits may be possible using the present technology. The disclosed methods can provide a platform to produce flexible electronics systems with improved integration of active components and passive interconnections, e.g., including integration with miniaturized rigid electronic circuits, which will further transition away from rigid and stiff electronic assemblies to more flexible and unobtrusive options. The disclosed technology may be used to strengthen the infrastructure of manufacturing of smart flexible hybrid electronics systems.

Additional Exemplary Embodiments

The fabrication methods of the disclosed technology may also include fabrication processes to form a flexible circuit including passive and active electronic components, interconnects, and insulating layers, which may be fabricated using any existing or future developed microfabrication process.

Figure 10:
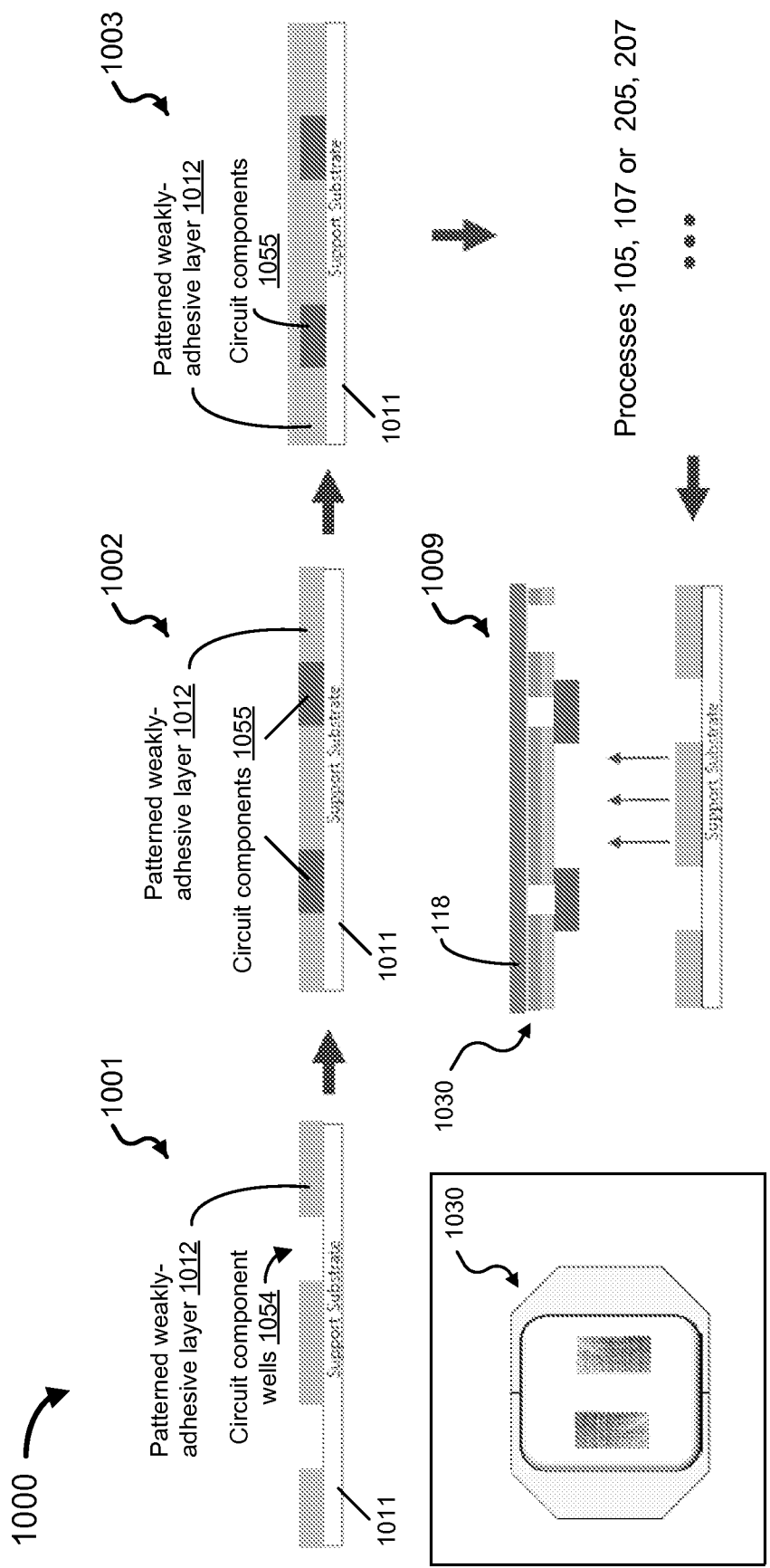
FIG. 10 shows an illustrative diagram of an exemplary fabrication method to produce a flexible electronic device including active and passive circuit components and devices integrated together.

FIG. 10 shows an illustrative diagram of an exemplary fabrication method 1000 to produce a flexible electronic device 1030 including active and passive circuit components and devices integrated together, in which the flexible electronic device 1030 is capable of being peeled off of a re-usable processing substrate. The method 1000 includes a process 1001 to produce a patterned processing substrate including a support substrate 1011 and a weakly-adhesive layer 1012 formed on the support substrate 1011 in a pattern of wells 1054 to allow circuit components to be precisely placed in the wells 1054. The method 1000 includes a process 1002 to place one or more electronic components 1055 into the wells 1054 of the patterned processing substrate. For example, the pattern of wells 1054 can include one well or a plurality of wells, e.g., depending on the circuit design and quantity, type, and/or physical dimensions of the electronic component or components 1055 included in the circuit design. In some implementations, for example, the wells 1054 can be structured to have x-,y-,z-dimensions to be substantially the same as the x-,y-,z-dimensions of the electronic components to be placed therein. The method 1000 includes a process 1003 to deposit a conductive layer 114 (e.g., one or more metal layers) on the weakly-adhesive layer 1012 for a flexible circuit to be fabricated on the patterned processing substrate that can electrically interface with the electronic components 1055 positioned in the wells 1054. The process 1003 can be implemented as described previously for the process 103, for example. As shown in FIG. 10, the method 1000 includes the processes 105, and 107 (or 205 and 207) to form a single layer circuit 1020 that is designed to electrically interface with contact pads and/or electrically interfacing regions of the electronic components 1055. The method 1000 includes a process 1009 to produce a flexible electronic device 1030 by attaching the flexible substrate 118 to the formed circuit 1020 on the patterned processing substrate and detaching the circuit 1020 with the flexible substrate 118 attached thereto from the weakly-adhesive layer 112. The produced flexible electronic device 1030 includes the electronic components 1055 electrically integrated with underlying circuitry and/or devices attached to the flexible substrate 118.

In some implementations, for example, the process 1001 includes patterning the wells 1054 using a dummy template that embodies a pre-specified circuit design with the same-sized circuit components to be used in the device 1030, prepositioned in the x-y dimensions. The dummy template can be used as a mold to create the weakly-adhesive layer 1012 formed on the support substrate 1011 with patterned wells 1054. The dummy template can be positioned over the support substrate such that the same-sized circuit components are positioned in x, y, z space to form the precise volumes of the wells 1054. For example, when in contact with the desired dummy template, the weakly-adhesive layer is in a liquid phase, allowing it to conform and embody around the exact dimensions of the dummy structures to prevent it from filling the regions that will become the wells 1054 of the patterned processing substrate. Curing of the weakly-adhesive layer transforms the liquid structure into a solid one while maintaining the well patterns 1054. With the well patterns exactly positioned, shaped, and sized in the weakly-adhesive layer 1012, circuit components 1055 can be placed appropriately into their corresponding wells with a precise fit. In some embodiments of the patterned processing substrate, for example, the bottom of the wells 1054 can have a depth such that the weak-adhesion layer material is at the surface of the bottom of the well (e.g., weak-adhesion layer 1012 is exposed), or that the depth of the well 1054 reaches the support substrate 1011. In some implementations, for example, the wells 1054 are to embody close-to-exactly the same shape and size of the circuit components that will occupy them in the fabrication method, e.g., such that the wells 1054 movement or "play" of the circuit components is minimized during processing.

In some implementations, for example the process 1002 can include guiding the electronic components 1055 to the specific locations such that they are arranged to have specific orientations, alignments, and distances between them. Placement of electronic components 1055 can be performed manually or by automated tools, e.g., including industry standard pick-and-place tools to provide high accuracy and high throughput.

In some implementations, for example, the process 1009 can include peeling-off of the flexible electronic device 1030 by delamination of the flexible electronic device from the weakly-adhesive layer 1012. For example, this can be performed through a roll process using a roller having a large radius by which the flexible substrate 118 adheres to one end of the formed circuit 1020 and rolls over the entire circuit 1020 in the roll process, carefully detaching the circuit 1020 (e.g., detaching its components in a sequential manner along the roll path) from the patterned processing substrate and attaching to the flexible substrate 118.

In some implementations, for example, the process 1009 can include can include peeling-off of the flexible electronic device 1030 by vertical detachment of the flexible electronic device 1030. For example, planar vertical motion of the flexible substrate 118 can be applied to attach the flexible substrate 118 to the formed circuit 1020 on the patterned processing substrate, and the produced flexible electronic device 1030 is detached from the weakly-adhesive layer 1012 by applying a planar vertical motion away from the patterned processing substrate, e.g., lifting the flexible electronic device 1030. Similarly, for example, the inverse can be applied, where the produced flexible electronic device 1030 is secured and the patterned processing substrate is vertically lifted away. The weakly-adhesive layer 1012 (of the patterned processing substrate) should be stationary for facilitating a planar vertical motion of peel-off. An example of this is the immobilization of the patterned processing substrate can include using a vacuum process that hold the patterned processing substrate down while a vertical motion of the flexible substrate 118 is applied to safely detach the produced flexible electronics device 1030 without failure or damage to the components of the device 1030 and the patterned processing substrate. In some implementations of vertical peel-off, for example, the edges of the circuit 1020 are delaminated slightly from the weakly-adhesive layer 1012 so as to induce a mechanism for peel-off.

The electronic components 1055 can include, but are not limited to, e.g., commercially available microchips (e.g., such as bare die, surface mount units, thin film circuits or chips, etc.) including processors, memory, converters, radio transmitters, etc.; integrated circuits including amplifiers (e.g., biopotential amplifiers, operational amplifiers, instrumentation amplifiers, power amplifiers, low-noise amplifiers, etc.), optocouplers, comparators, digital logic circuits, power converters, etc.; sensors/transducers including piezoelectrics, microphones, electrochemical sensors, accelerometers, gyroscopes, strain gauges, electrodes (e.g., biopotential electrodes), infrared sensors, ultrasound sensors, thermistors, speakers, ultrasound, antennas, heating elements/coils, etc.; electrical circuit components including resistors, capacitors, inductors, diodes, light-emitting diodes (LEDs), transistors, batteries, etc.; and Microelectromechanical Systems (MEMS) technology. In some implementations, for example, the size of the electronic components 1054 can range individually from around 100 µm to one or a more millimeters (e.g., 3 mm) in the x-y dimensions and from around tens or a hundred microns (e.g., 100 µm) to hundreds of microns (e.g., 400 µm) in the z dimension.

In some embodiments of the method 1000, for example, the method 1000 includes the processes 133, 135, and 137 (or 133, 235, and 237) modified to accommodate the circuit components 1055 as part of a multi-layer flexible electronic device 1030.

In some implementations of the method 1000, for example, the process 1001 can include using a template structure that includes a pattern to contact the support substrate 1011 at the locations to which the circuit component wells 1054 are to be positioned, and which allows for the weakly-adhesive material to be deposited to form around the pattern and cured to form the template structure. For example, the pattern can be formed by a guided attachment process of model or dummy components (e.g., substituting for the particular electronic components to be fabricated in the method 1000) to produce the template structure, e.g., where the model or dummy components have the same geometry as the electronic components 1055 to be used in the circuit or device design to be produced by the method 1000. The process 1001 can include forming a flat surface on the outward side of the weakly-adhesive interface layer 1012 at least in the regions proximate to that with the trenches or wells 1054 that receive the electronic components 1055. For example, the flat surface allows electronic components 1055 to be precisely contacted by and integrated with the interconnects formed by subsequent processes of the method 1000 to produce the desired flexible integrated electronic device 1030. In some implementations, for example, the process 1001 can include forming a non-flat surface at the bottom of the wells 1054 to allow for voids over at least a portion of the surface area to which the circuit components 1055 will contact upon placement from the process 1002. For example, the wells 1054 can be structured to have x-,y-dimensions to be substantially the same as the x-,y-dimensions of the electronic components to be placed therein, but include a curved dome void (or multiple smaller voids) at the bottom of the well.

Figure 11:
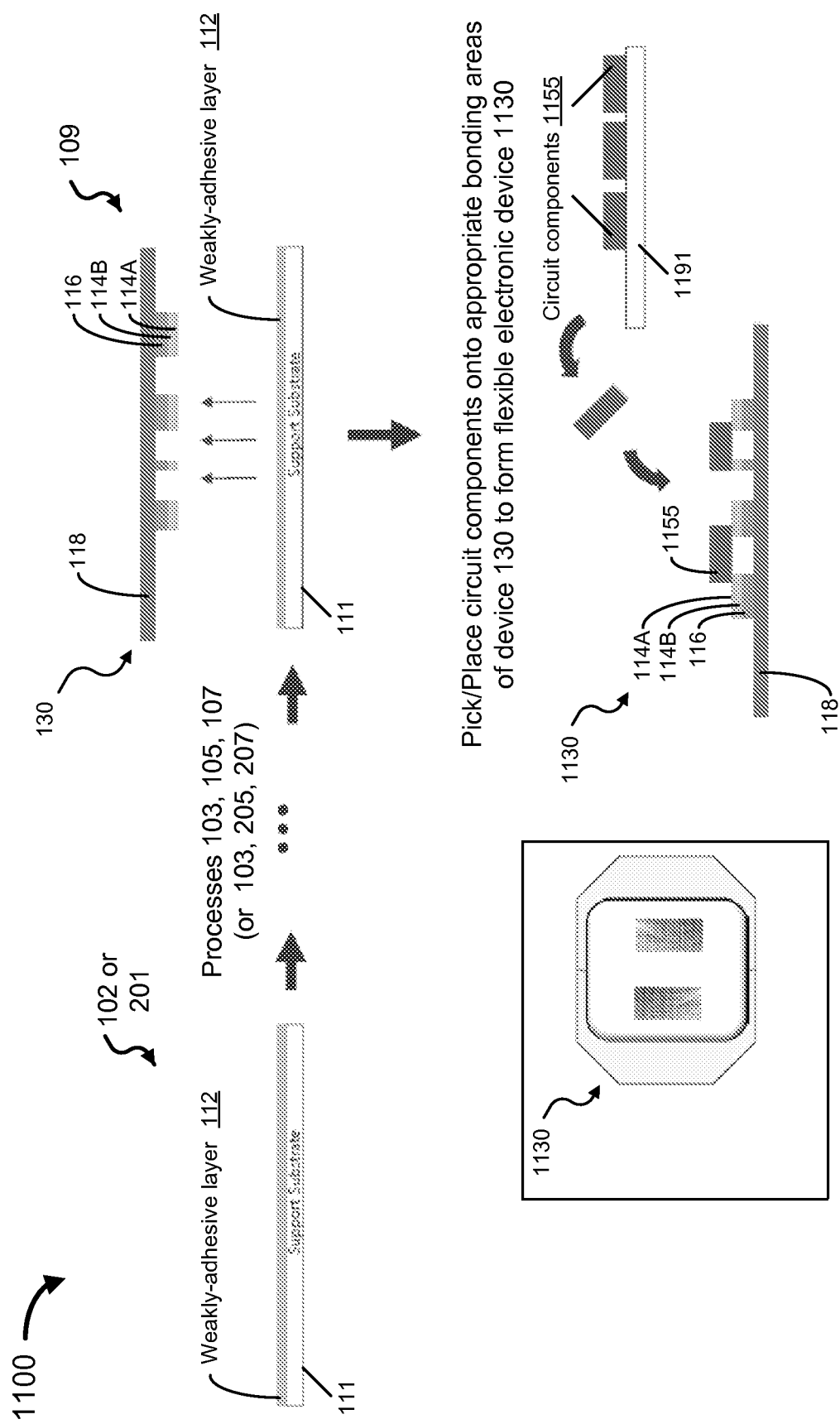
FIG. 11 shows an illustrative diagram of an exemplary fabrication method for post-processing of a produced flexible electronic circuit or device to integrate active and/or passive circuit components and devices.

FIG. 11 shows an illustrative diagram of an exemplary fabrication method 1100 for post-processing of a produced flexible electronic circuit or device to integrate active and/or passive circuit components and devices using pick-and-place techniques. As shown in FIG. 11, the method 1100 includes the processes 102 or 201, 103, 105 and 107 (or 205 and 207) to form a single-layer flexible electronic circuit 1120; or similarly includes the processes 133, 135 (or the process 205 adapted for the second circuit layer), and 137 (or the process 207 adapted for the second circuit layer) to form a multi-layer flexible electronic circuit 1125 on the processing substrate. The method 1100 includes a post-processing technique to 'pick-and-place' electronic/circuit components 1155 from manufacturing substrate 1191 onto the appropriate bonding areas of the device 1120 or 1125 to form a flexible integrated electronic device 1130.

EXAMPLES

The following examples are illustrative of several embodiments of the present technology. Other exemplary embodiments of the present technology may be presented prior to the following listed examples, or after the following listed examples.

In an example of the present technology (example 1), a method to fabricate an electronic device includes depositing an electrically conductive layer on a processing substrate, in which the processing substrate includes an interface layer including a weakly-adhesive material on a support substrate; depositing an insulating layer on the conductive layer that attaches to the conductive layer; forming a circuit structure on the processing substrate by removing selected portions of the conductive layer based on a circuit design; and producing a flexible electronic device by attaching a flexible substrate to the formed circuit structure on the processing substrate and detaching the circuit structure and the flexible substrate from the interface layer, in which the flexible electronic device includes the circuit structure attached to the flexible substrate.

Example 2 includes the method as in example 1, further including forming the processing substrate by depositing the interface layer including a weakly-adhesive material on the support substrate.

Example 3 includes the method as in example 1, in which the weakly-adhesive material includes poly(dimethylsiloxane) (PDMS) or polyimide.

Example 4 includes the method as in example 1, in which the flexible substrate includes Tegaderm, or Scotch tape.

Example 5 includes the method as in example 1, in which the support substrate includes a silicon (Si) wafer.

Example 6 includes the method as in example 1, in which the electrically conductive layer includes gold or silver.

Example 7 includes the method as in example 1, in which the insulating layer includes polyimide.

Example 8 includes the method as in example 1, in which the electrically conductive layer includes chromium, in which the depositing the electrically conductive layer includes first depositing a gold layer on the interface layer of the processing substrate, and next depositing a chromium layer on the gold layer.

Example 9 includes the method as in example 1, in which the detaching includes peeling off the flexible substrate having the circuit structure attached thereto from the interface layer of the processing substrate.

Example 10 includes the method as in example 1, further including: after the detaching the circuit structure and the flexible substrate from the interface layer, reusing the processing substrate to form another flexible electronic device.

Example 11 includes the method as in example 1, in which the processing substrate is a flexible processing substrate including the interface layer on a flexible support structure.

Example 12 includes the method as in example 11, in which the flexible support structure includes Kapton.

Example 13 includes the method as in example 1, in which the depositing the insulating layer on the conductive layer includes patterning the insulating layer to form a pattern mask over the conductive layer, and the removing includes wet etching the selected portions of the conductive layer that are uncovered by the pattern mask to form the circuit structure.

Example 14 includes the method as in example 1, in which the forming the circuit structure on the processing substrate includes laser etching the selected portions of the conductive layer and regions of the insulating layer overlaying the selected portions of the conductive layer.

Example 15 includes the method as in example 1, in which the formed circuit structure on the processing substrate includes a single layer circuit structure, and the method further includes depositing a second electrically conductive layer on the formed single layer circuit structure on the processing substrate; depositing a second insulating layer on the conductive layer to attach to the second conductive layer; and forming a multi-layer circuit structure on the processing substrate by removing selected portions of the second conductive layer based on the circuit design, in which the produced flexible electronic device includes the multi-layer circuit structure attached to the flexible substrate.

Example 16 includes the method as in example 15, in which the forming the multi-layer circuit includes creating at least a partial encapsulation of an insulating material on the multi-layer circuit on the processing substrate.

Example 17 includes the method as in example 16, in which the insulating material of the encapsulation includes polyimide.

Example 18 includes the method as in example 17, in which the creating the encapsulation includes depositing the polyimide on the multi-layer circuit and curing the polyimide to form the encapsulation.

Example 19 includes the method as in example 16, in which the encapsulation encapsulates the exposed regions of the multi-layer circuit not in contact with the processing substrate.

Example 20 includes the method as in example 1, further including attaching an electronic component at a location on the circuit structure of the flexible electronics device, in which the attaching the electronic component on the flexible electronic device includes orienting the electronic component such that the conductive portions of the electronic component are in contact with corresponding regions of the circuit structure of the flexible electronics device.

In an example of the present technology (example 21), a method to fabricate a circuit includes providing a processing substrate structured to include a weakly-adhesive surface on a support substrate; depositing an electrically conductive layer on the weakly-adhesive surface of the processing substrate; depositing an insulating layer on the conductive layer that attaches to the conductive layer; etching the conductive layer on the processing substrate to form a circuit; and attaching a flexible substrate to the formed circuit on the processing substrate.

Example 22 includes the method as in example 21, further including detaching the circuit attached to the flexible substrate from the processing substrate.

Example 23 includes the method as in example 22, further including, after the detaching the circuit and the flexible substrate from the processing substrate, reusing the processing substrate to produce another circuit.

Example 24 includes the method as in example 22, further including, after the detaching the circuit and the flexible substrate from the processing substrate, attaching an electronic component at a location on the circuit, in which the attaching the electronic component on the flexible electronic device includes orienting the electronic component such that the conductive portions of the electronic component are in contact with corresponding regions of the circuit structure of the flexible electronics device.

Example 25 includes the method as in example 21, further including forming the processing substrate by depositing a weakly-adhesive material layer on the support substrate.

Example 26 includes the method as in example 21, in which the depositing the insulating layer on the conductive layer includes patterning the insulating layer to form a pattern mask over the conductive layer, and in which the etching includes wet etching portions of the conductive layer that are uncovered by the pattern mask to form the circuit.

Example 27 includes the method as in example 21, in which the forming the circuit on the processing substrate includes laser etching regions of the conductive layer and the insulating layer overlaying the selected portions of the conductive layer.

Example 28 includes the method as in example 21, in which the support substrate includes a flexible material, and the processing substrate is a flexible processing substrate.

Example 29 includes the method as in example 28, in which the attaching the flexible substrate to the circuit includes applying a roll having an outer surface including the flexible substrate to the circuit on the flexible processing substrate, in which the circuit is detached from the flexible processing substrate the flexible substrate on the roll.

Example 30 includes the method as in example 21, further including, after the etching the conductive layer on the processing substrate, depositing a second electrically conductive layer on the circuit; depositing a second insulating layer on the conductive layer to attach to the second conductive layer; etching the second conductive layer on the processing substrate to form a multi-layer circuit; and creating at least a partial encapsulation of an insulating material on the multi-layer circuit on the processing substrate.

In an example of the present technology (example 31), a method to fabricate an electronic device includes providing a processing substrate structured to include a weakly-adhesive layer on a support substrate, in which the weakly-adhesive layer includes a well at a predetermined position in the weakly-adhesive layer; placing an electronic components into the wells of the processing substrate; depositing an electrically conductive layer on the processing substrate; depositing an insulating layer on the conductive layer that attaches to the conductive layer; forming a circuit structure on the processing substrate by removing selected portions of the conductive layer based on a circuit design, in which the circuit structure includes the electronic component and interconnections that electrically interface with contact pads of the electronic component; and producing a flexible electronic device by attaching a flexible substrate to the formed circuit structure on the processing substrate, and detaching the circuit structure with the flexible substrate from the weakly-adhesive layer.

Example 32 includes the method as in example 31, in which the produced flexible electronic device includes the electronic component electrically integrated with underlying circuitry of the circuit structure attached to the flexible substrate.

Example 33 includes the method as in example 31, further including forming the processing substrate by creating the well in the weakly-adhesive layer using a template, in which the template includes a surface substrate and a mold component of a shape and size substantially the same as the electronic component attached to the surface substrate, and the creating includes positioning the template over the support substrate such that the mold component is aligned with a location where the electronic component is to be positioned in the circuit structure, depositing the weakly-adhesive layer in a liquid phase to conform around the mold component on the support substrate, and curing the weakly-adhesive layer to transform the liquid phase into a solid phase, and removing the template.

Example 34 includes the method as in example 31, in which the depositing the insulating layer on the conductive layer includes patterning the insulating layer to form a pattern mask over the conductive layer, and in which the removing includes wet etching portions of the conductive layer that are uncovered by the pattern mask to form the circuit.

Example 35 includes the method as in example 31, in which the forming the circuit on the processing substrate includes laser etching the selected portions of the conductive layer and regions of the insulating layer overlaying the selected portions of the conductive layer.

Example 36 includes the method as in example 31, further including, after the forming the circuit structure on the processing substrate, depositing a second electrically conductive layer on the circuit structure over the processing substrate; depositing a second insulating layer on the conductive layer to attach to the second conductive layer; removing selected regions of the second conductive layer and overlying second insulating layer on the processing substrate to form a multi-layer circuit structure; and creating at least a partial encapsulation of an insulating material on the multi-layer circuit on the processing substrate.

In an example of the present technology (example 37), a method to fabricate a circuit includes providing a support substrate with a weakly-adhesive layer on the support substrate; depositing a metal layer on the weakly-adhesive layer to form conductive regions for a circuit; patterning a photo-definable polymer layer on the metal layer; etching the metal layer to form the circuit while on the weakly-adhesive layer; and forming a flexible circuit by applying a flexible final substrate to attach to the circuit while on the weakly-adhesive layer on the support substrate.

Example 38 includes the method as in example 37, further including detaching the flexible circuit from the weakly-adhesive layer on the support substrate by peeling off the flexible final substrate with the attached circuit from the weakly-adhesive layer.

Example 39 includes the method as in example 38, further including, after detaching of the flexible circuit, reusing the support substrate and the weakly-adhesive layer thereon to form a next flexible circuit.

Example 40 includes the method as in example 37, in which the metal layer includes gold or chromium.

Example 41 includes the method as in example 40, in which the depositing the metal layer includes first depositing a gold layer on the weakly-adhesive layer, and next depositing a chromium layer on the gold layer.

Example 42 includes the method as in example 37, in which the flexible circuit includes a flexible electronic sensor.

Example 43 includes the method as in example 37, further including forming the weakly-adhesive layer on the support substrate.

Example 44 includes the method as in example 37, in which the support substrate includes a silicon (Si) wafer.

Example 45 includes the method as in example 37, in which the photo-definable polymer layer includes polyimide.

Example 46 includes the method as in example 37, in which the flexible substrate includes Tegaderm.

While this patent document contains many specifics, these should not be construed as limitations on the scope of any disclosed methods or of what may be claimed, but rather as descriptions of features that may be specific to particular embodiments of particular disclosed methods. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method to fabricate a flexible electronic device, comprising:

depositing an electrically conductive layer on a weakly-adhesive material of a processing substrate, wherein the processing substrate includes a rigid support substrate and an interface layer comprising the weakly-adhesive material attached on the rigid support substrate;

depositing an insulating layer on the conductive layer that attaches to the conductive layer;

forming a circuit structure on the processing substrate by removing selected portions of the conductive layer based on a circuit design; and producing a flexible electronic device by attaching a flexible substrate to the formed circuit structure on the processing substrate and detaching the circuit structure and the flexible substrate from the weakly-adhesive material attached on the rigid support substrate without dissolution of a material of the processing substrate or the circuit structure, wherein the detaching of the circuit structure and the flexible substrate leaves the interface layer attached to the rigid support substrate to allow a further use of the processing substrate for fabricating another flexible electronic device, and wherein the flexible electronic device includes the circuit structure attached to the flexible substrate.

2. The method as in claim 1, further comprising:
    forming the processing substrate by depositing the interface layer including the weakly-adhesive material on the rigid support substrate.

3. The method as in claim 1, wherein materials used in the method include one or more of the following:
    the weakly-adhesive material includes poly(dimethylsiloxane) (PDMS) or polyimide;
    the flexible substrate includes an adhesive tape;
    the rigid support substrate includes a silicon (Si) wafer;
    the electrically conductive layer includes gold or silver;
    the insulating layer includes polyimide.

4. The method as in claim 1, wherein the electrically conductive layer includes chromium, wherein the depositing the electrically conductive layer includes first depositing a gold layer on the interface layer of the processing substrate, and next depositing a chromium layer on the gold layer.

5. The method as in claim 1, wherein the detaching includes peeling off the flexible substrate having the circuit structure attached thereto from the interface layer of the processing substrate.

6. The method as in claim 1, further comprising:
    after the detaching the circuit structure and the flexible substrate from the interface layer, reusing the processing substrate to form another flexible electronic device.

7. The method as in claim 1, wherein the processing substrate is a flexible processing substrate including the interface layer on a flexible support structure.

8. The method as in claim 7, wherein the flexible support structure includes a polyimide material.

9. The method as in claim 1, wherein the depositing the insulating layer on the conductive layer includes patterning the insulating layer to form a pattern mask over the conductive layer, and the removing includes wet etching the selected portions of the conductive layer that are uncovered by the pattern mask to form the circuit structure.

10. The method as in claim 1, wherein the forming the circuit structure on the processing substrate includes laser etching the selected portions of the conductive layer and regions of the insulating layer overlaying the selected portions of the conductive layer.

11. The method as in claim 1, wherein the formed circuit structure on the processing substrate includes a single layer circuit structure, the method further comprising:

depositing a second electrically conductive layer on the formed single layer circuit structure on the processing substrate;

depositing a second insulating layer on the conductive layer to attach to the second conductive layer; and forming a multi-layer circuit structure on the processing substrate by removing selected portions of the second conductive layer based on the circuit design, wherein the produced flexible electronic device includes the multi-layer circuit structure attached to the flexible substrate.

12. The method as in claim 11, wherein the forming the multi-layer circuit includes creating at least a partial encapsulation of an insulating material on the multi-layer circuit on the processing substrate.

13. The method as in claim 12, wherein the insulating material of the encapsulation includes polyimide; and wherein the creating the encapsulation includes depositing the polyimide on the multi-layer circuit and curing the polyimide to form the encapsulation.

14. The method as in claim 12, wherein the encapsulation encapsulates the exposed regions of the multi-layer circuit not in contact with the processing substrate.

15. The method as in claim 1, further comprising:
attaching an electronic component at a location on the circuit structure of the flexible electronics device, wherein the attaching the electronic component on the flexible electronic device includes orienting the electronic component such that the conductive portions of the electronic component are in contact with corresponding regions of the circuit structure of the flexible electronics device.

* * * * *